US010930590B1

(12) United States Patent
Yu et al.

(10) Patent No.: US 10,930,590 B1
(45) Date of Patent: Feb. 23, 2021

(54) INTERCONNECT DEVICE AND METHOD

(71) Applicant: Taiwan Semiconductor Manufacturing Company, Ltd., Hsinchu (TW)

(72) Inventors: Dian-Sheg Yu, Hsinchu (TW); Ren-Fen Tsui, Taipei (TW); Jhon Jhy Liaw, Zhudong Township (TW); Ying-Jhe Fu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/549,110

(22) Filed: Aug. 23, 2019

(51) Int. Cl.
| | |
|---|---|
| *G11C 8/00* | (2006.01) |
| *H01L 23/528* | (2006.01) |
| *H01L 27/11* | (2006.01) |
| *H01L 23/522* | (2006.01) |
| *H01L 21/768* | (2006.01) |
| *G11C 11/412* | (2006.01) |
| *G11C 11/418* | (2006.01) |

(52) U.S. Cl.
CPC .......... *H01L 23/528* (2013.01); *G11C 11/412* (2013.01); *G11C 11/418* (2013.01); *H01L 21/7684* (2013.01); *H01L 21/76816* (2013.01); *H01L 21/76877* (2013.01); *H01L 23/5226* (2013.01); *H01L 27/1104* (2013.01); *H01L 27/1116* (2013.01)

(58) Field of Classification Search
CPC .................................................... G11C 11/412
USPC ........................................................ 365/156
See application file for complete search history.

(56) References Cited

U.S. PATENT DOCUMENTS

| | | |
|---|---|---|
| 6,781,899 B2 | 8/2004 | Han et al. |
| 7,723,806 B2 | 5/2010 | Liaw |
| 8,605,523 B2 | 12/2013 | Tao et al. |
| 8,630,132 B2 | 1/2014 | Cheng et al. |
| 8,760,948 B2 | 6/2014 | Tao et al. |
| 9,997,522 B2 | 6/2018 | Lai et al. |
| 2011/0222332 A1 | 9/2011 | Liaw et al. |
| 2012/0043615 A1 | 2/2012 | Yamada |
| 2013/0292777 A1 | 11/2013 | Liaw |
| 2014/0032871 A1 | 1/2014 | Hsu et al. |

(Continued)

FOREIGN PATENT DOCUMENTS

| | | |
|---|---|---|
| CN | 101047186 A | 10/2007 |
| DE | 102016116001 A1 | 6/2017 |

(Continued)

*Primary Examiner* — Hoai V Ho
(74) *Attorney, Agent, or Firm* — Slater Matsil, LLP

(57) ABSTRACT

In some embodiments of the method, patterning the opening includes: projecting a radiation beam toward the second dielectric layer, the radiation beam having a pattern of the opening. In some embodiments of the method, the single-patterning photolithography process is an extreme ultraviolet (EUV) lithography process. In some embodiments of the method, filling the opening with the conductive material includes: plating the conductive material in the opening; and planarizing the conductive material and the second dielectric layer to form the first metal line from remaining portions of the conductive material, top surfaces of the first metal line and the second dielectric layer being planar after the planarizing.

18 Claims, 19 Drawing Sheets

(56) References Cited

U.S. PATENT DOCUMENTS

| | | |
|---|---|---|
| 2014/0151812 A1* | 6/2014 | Liaw .................. H01L 27/1108 257/368 |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2016/0240541 A1* | 8/2016 | Liaw .................. H01L 27/1104 |
| 2017/0154671 A1 | 6/2017 | Liaw |
| 2018/0158516 A1 | 6/2018 | Park et al. |

FOREIGN PATENT DOCUMENTS

| | | |
|---|---|---|
| IE | 10249605 B4 | 3/2009 |
| JP | 2012043879 A | 3/2012 |
| KR | 20140080475 A | 6/2014 |
| KR | 20180065073 A | 6/2018 |

* cited by examiner

US 10,930,590 B1

INTERCONNECT DEVICE AND METHOD

BACKGROUND

Generally, active devices and passive devices are formed on and in a semiconductor substrate. Once formed, these active devices and passive devices may be connected to each other and to external devices using a series of conductive and insulative layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
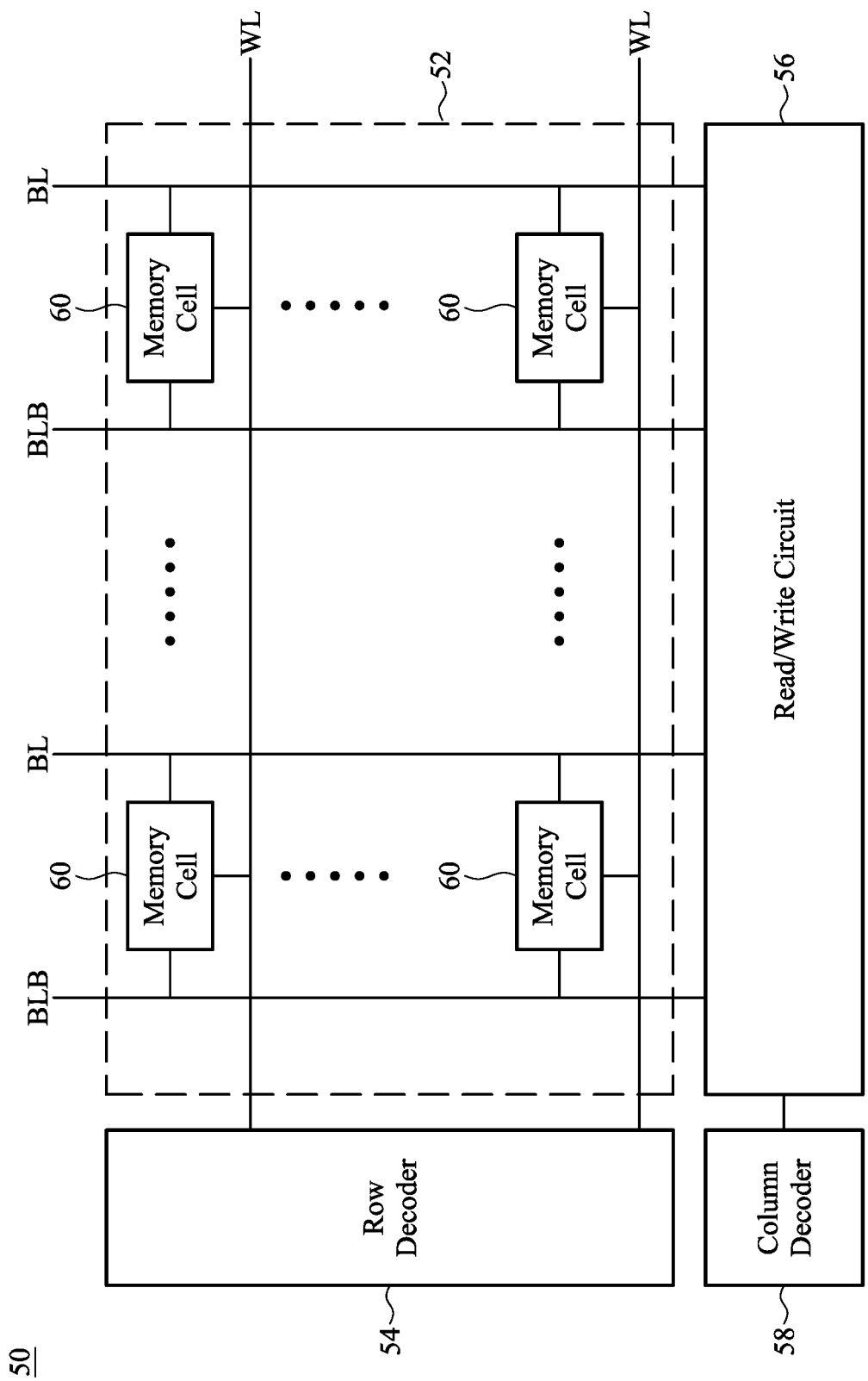
FIG. 1 is a block diagram of a memory, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, metal lines for a memory cell are formed, interconnecting the transistors of the memory cell. The memory cell may be, e.g., a static random-access memory (SRAM) cell. The metal lines are formed by using next-generation lithography techniques such as extreme ultraviolet (EUV) lithography. Metal lines of arbitrary shapes and very small dimensions may thus be formed. Advantageously, the metal lines may be formed with main line portions and pad portions. The pad portions are wider than the main line portions, and may be used for coupling to underlying conductive vias. The contact area to the underlying conductive vias is larger, which may decrease resistivity of the contacts.

FIG. 1 is a block diagram of a memory 50, in accordance with some embodiments. The memory 50 includes a memory cell array 52, a row decoder 54, a read/write circuit 56, and a column decoder 58. The memory cell array 52 includes memory cells 60 arranged in rows and columns. The row decoder 54 may be, e.g., a static CMOS decoder, a pseudo-NMOS decoder, or the like. During operation, the row decoder 54 selects desired memory cells 60 in a row of the memory cell array 52 by activating the respective word line WL for the row. The read/write circuit 56 may include writer drivers, sense amplifiers, combinations thereof, or the like. During operation, the read/write circuit 56 reads data from or writes data to desired memory cells 60 in the memory cell array 52 with complimentary bitlines BL and BLB. The column decoder 58 may be, e.g., a static CMOS decoder, a pseudo-NMOS decoder, or the like. During operation, the column decoder 58 selects the complimentary bitlines BL and BLB for the desired memory cells 60 in columns of the memory cell array 52.

Figure 2:
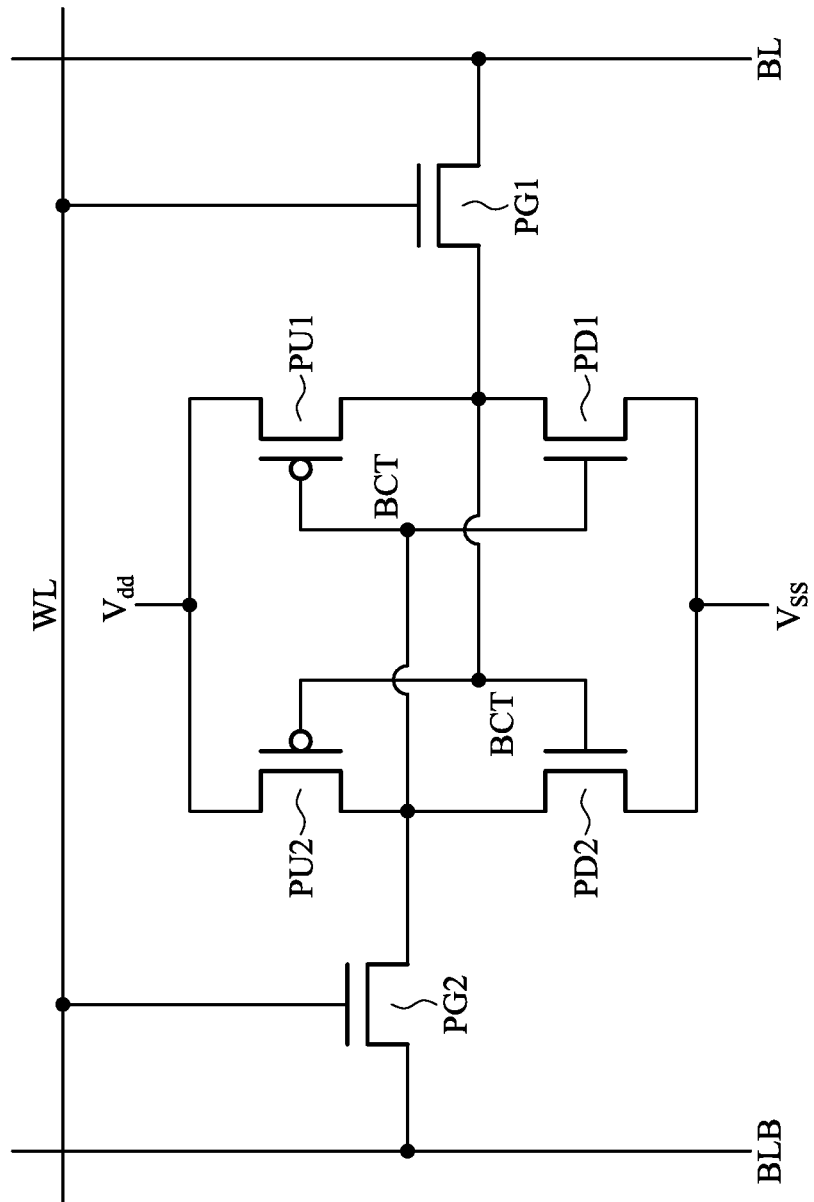
FIG. 2 is a circuit diagram of a memory cell, in accordance with some embodiments.

FIG. 2 is a circuit diagram of a memory cell 60, in accordance with some embodiments. The memory cell 60 is a six-transistor SRAM cell. The memory cell 60 includes pull-up transistors PU1 and PU2, and pull-down transistors PD1 and PD2, which collectively store one bit. The pull-up transistors PU1 and PU2 are connected to a power supply voltage node $V_{dd}$, and the pull-down transistors PD1 and PD2 are connected to a ground voltage node $V_{ss}$. The memory cell 60 also includes pass-gate transistors PG1 and PG2, which are connected to the word line WL and complimentary bitlines BL and BLB for the memory cell 60. When the pass-gate transistors PG1 and PG2 are enabled, the value of the memory cell 60 may be read with the complimentary bitlines BL and BLB, and a new value may be written to the memory cell 60 with the complimentary bitlines BL and BLB.

Figure 3:
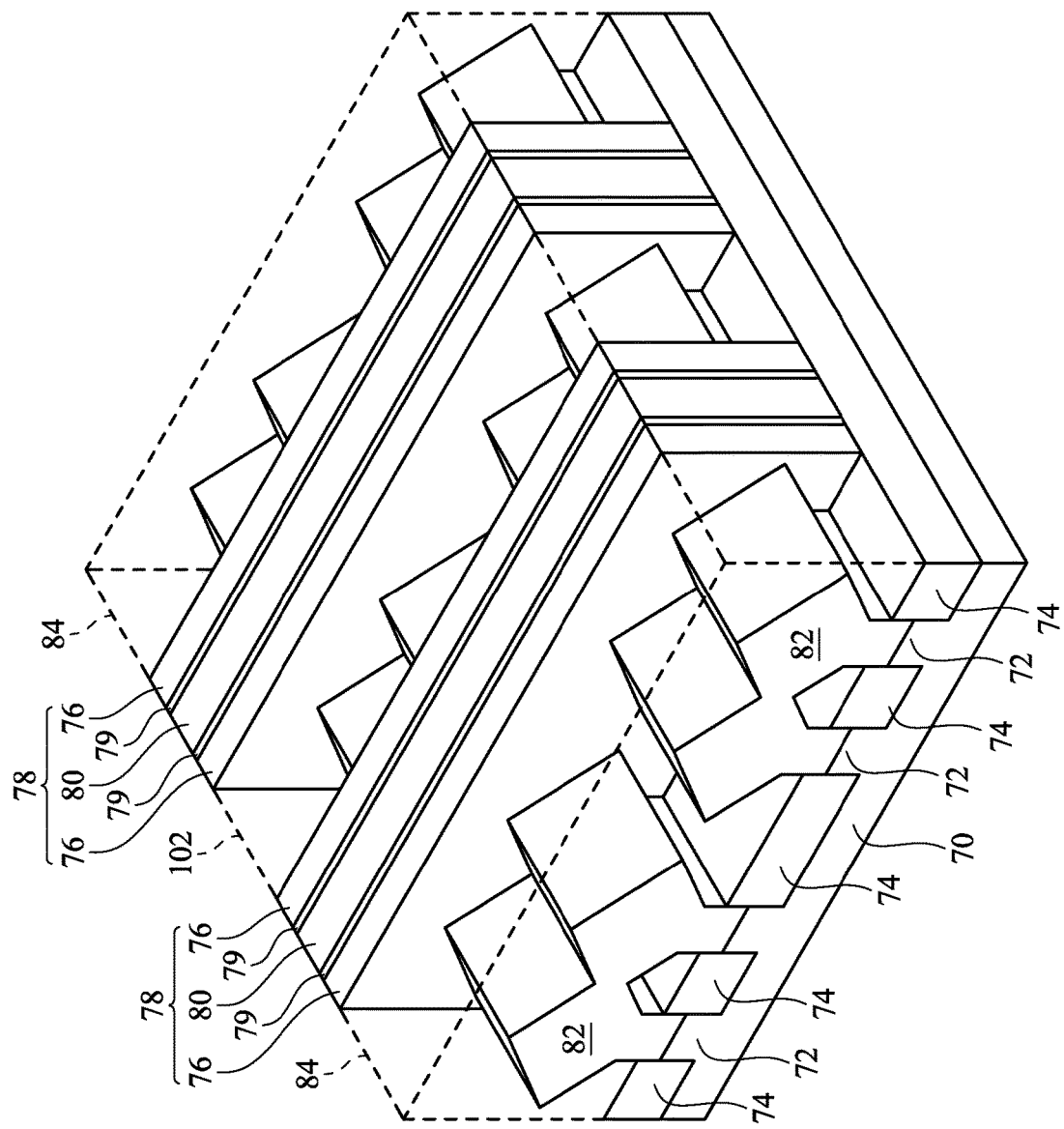
FIG. 3 illustrates an example of simplified Fin Field-Effect Transistors (FinFETs) in a three-dimensional view, in accordance with some embodiments.

FIG. 3 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or more, such as four transistors. As discussed further below, the memory cells 60 (see FIGS. 1 and 2) may be realized using FinFETs such as those illustrated in FIG. 3.

The FinFETs comprise fins 72 extending from a substrate 70. Shallow trench isolation (STI) regions 74 are disposed over the substrate 70, and the fins 72 protrude above and from between neighboring STI regions 74. Additionally, although the fins 72 are illustrated as being a single, continuous material of the substrate 70, the fins 72 and/or the substrate 70 may comprise a single material or a plurality of materials. In this context, the fins 72 refers to the portions extending between the neighboring STI regions 74.

The substrate 70 may be a semiconductor substrate, such as a bulk semiconductor, a semiconductor-on-insulator (SOI) substrate, or the like, which may be doped (e.g., with a p-type or an n-type dopant) or undoped. The substrate 70 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 70 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. For example, when p-type devices are formed, the substrate 70 may be a strained material such as silicon germanium ($Si_xGe_{1-x}$, where x can be in the range of 0 to 1) having a germanium concentration in the range of about 0% to about 40%, such that FinFETs with p-type fully strained channel (PFSC) regions are formed.

The fins 72 are semiconductor strips. In some embodiments, the fins 72 may be formed in the substrate 70 by etching trenches in the substrate 70, with remaining material of the substrate 70 between the trenches forming the fins 72. The etching may be any acceptable etch process, such as a reactive ion etch (RIE), neutral beam etch (NBE), the like, or a combination thereof. The etch process may be anisotropic.

The STI regions 74 are formed of an insulation material. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and cured to make it convert to another material, such as an oxide), the like, or a combination thereof. Other insulation materials formed by any acceptable process may be used. In the illustrated embodiment, the insulation material is silicon oxide formed by a FCVD process. In some embodiments a liner (not shown) may first be formed along a surface of the substrate 70 and the fins 72, and a fill material (such as the insulation material described above) may be formed on the liner. A removal process is applied to the insulation material to expose the fins 72. In some embodiments, a planarization process such as a chemical mechanical polish (CMP), an etch back process, combinations thereof, or the like may be utilized to expose the fins 72, with portions of the insulation material remaining after the planarization process forming the STI regions 74.

The process described above is just one example of how the fins 72 may be formed. The fins 72 and STI regions 74 may be formed with any acceptable process. For example, in another embodiment, the fins 72 may be formed by an epitaxial growth process.

Gate spacers 76 are along sidewalls and over top surfaces of the fins 72. Gate stacks 78 are disposed between neighboring pairs of the gate spacers 76. The gate stacks 78 include gate dielectrics 79 on the fins 72 and STI regions 74, and gate electrodes 80 over the gate dielectrics 79. Source/drain regions 82 are epitaxially grown regions over the fin 72 on opposite sides of the gate dielectrics 79 and gate electrodes 80. The gate spacers 76 separate the source/drain regions 82 from the gate dielectrics 79 and gate electrodes 80. In embodiments where multiple transistors are formed, the source/drain regions 82 may be shared between various transistors. In embodiments where one transistor is formed from multiple fins 72, neighboring source/drain regions 82 may be electrically connected, such as through coalescing the source/drain regions 82 by epitaxial growth, or through coupling the source/drain regions 82 with a same source/drain contact.

The gate dielectrics 79 and gate electrodes 80 may be formed with a gate-first process or a gate-last process. When a gate-first process is used, the gate dielectrics 79 and gate electrodes 80 are initially formed over channel regions of the fins 72, and the gate spacers 76 are then deposited along sidewalls of the gate dielectrics 79 and gate electrodes 80. When a gate-last process is used, dummy gate stacks are initially formed on channel regions of the fins 72, the gate spacers 76 are deposited along sidewalls of the dummy gate stacks, and the dummy gate stacks are then replaced with the gate dielectrics 79 and gate electrodes 80.

The gate spacers 76 may be formed of a dielectric material, such as silicon nitride, silicon carbon nitride, a combination thereof, or the like. In some embodiments (not shown), the gate spacers 76 are formed from a multi-layered insulating material, and include multiple layers. For example, the gate spacers 76 may include multiple layers of silicon nitride, or may include a layer of silicon oxide disposed between two layers of silicon nitride.

The gate dielectrics 79 may be formed of a dielectric material, such as silicon oxide, silicon nitride, or multilayers thereof. In some embodiments, the gate dielectrics 79 include a high-k dielectric material, and in these embodiments, the gate dielectrics 79 may have a k value greater than about 7.0, and may include a metal oxide or a silicate of Hf, Al, Zr, La, Mg, Ba, Ti, Pb, and combinations thereof. The formation methods of the gate dielectrics 79 may include Molecular-Beam Deposition (MBD), atomic layer deposition (ALD), PECVD, and the like. The gate electrodes 80 are deposited over the gate dielectrics 79, respectively. The gate electrodes 80 may include a metal-containing material such as TiN, TiO, TaN, TaC, Co, Ru, Al, W, combinations thereof, or multi-layers thereof. For example, although single-layered gate electrodes 80 are illustrated, the gate electrodes 80 may comprise any number of liner layers, any number of work function tuning layers, and a fill material. After the filling of the gate electrodes 80, a planarization process, such as a CMP, may be performed to remove the excess portions of the gate dielectrics 79 and gate electrodes 80 over the gate spacers 76.

The source/drain regions 82 may be formed by an epitaxial growth process. In such embodiments, recesses are formed in the fins 72, adjacent the gate spacers 76. One or more epitaxy processes are performed to grow the source/drain regions 82 in the recesses. The source/drain regions 82 may be formed of any acceptable material for p-type or n-type devices. For example, when n-type devices are desired, the source/drain regions 82 can include materials exerting a tensile strain in the channel regions of the fins 72, such as silicon, SiC, SiCP, SiP, or the like. Likewise, when p-type devices are desired, the source/drain regions 82 can include materials exerting a compressive strain in the channel regions of the fins 72, such as SiGe, SiGeB, Ge, GeSn, or the like. The source/drain regions 82 are doped with n-type and/or p-type impurities, and can be in situ doped during growth, or can be implanted with dopants after growth.

FIGS. 4A through 9B are various views of intermediate stages in the manufacturing of a memory cell 60, in accordance with some embodiments. The memory cell 60 is manufactured using FinFETs similar to the FinFETs illustrated in FIG. 3. The manufacture of an interconnect for the FinFETs is shown, with the resulting structure interconnecting the FinFETs to form the memory cell 60. FIGS. 4A, 5A, 6A, 7A, 8A, and 9A are schematic views of the memory cell 60. FIGS. 4B, 5B, 6B, 7B, 8B, and 9B are cross-sectional views of the memory cell 60 illustrated along a reference cross-section B-B in FIG. 4A. Cross-section B-B extends through the source/drain region 82 of the FinFETs.

Figure 4A:
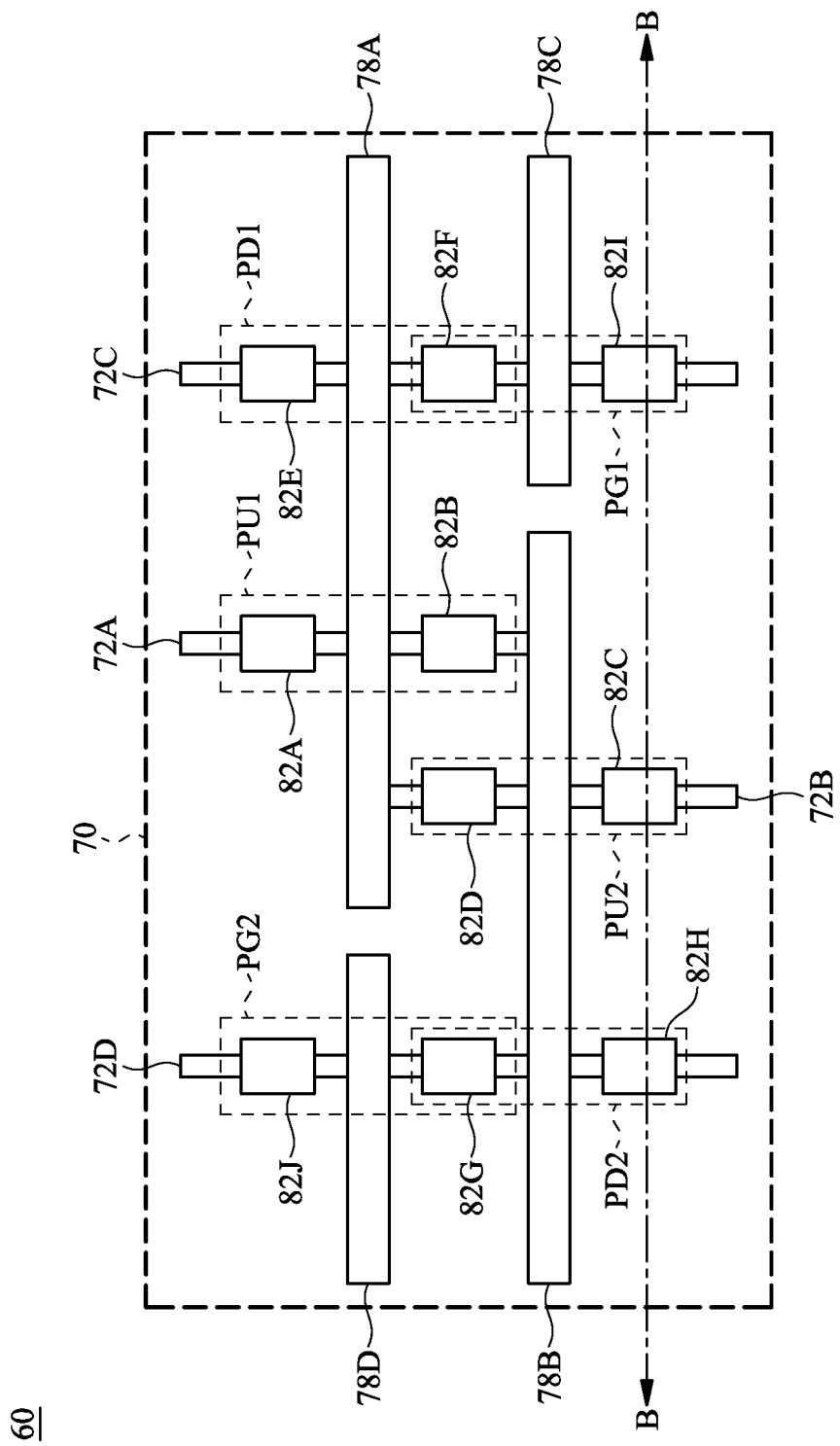
FIGS. 4A, 4B, 5A, 5B, 6A, 6B, 7A, 7B, 7C, 8A, 8B, 9A, and 9B are various views of intermediate stages in the manufacturing of a memory cell, in accordance with some embodiments.
Figure 4B:
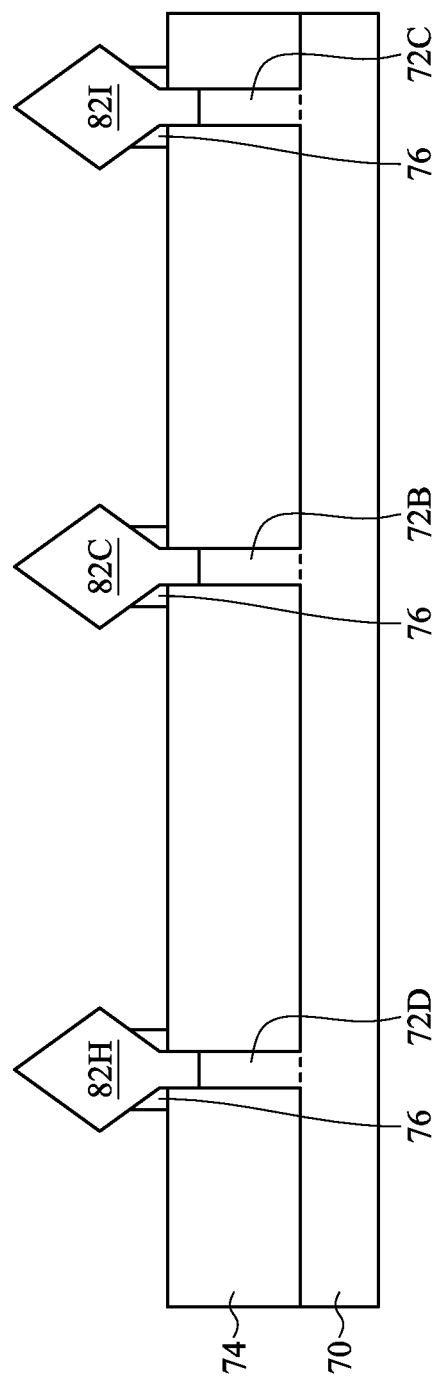

In FIGS. 4A and 4B, fins 72 are formed on a substrate 70. The STI regions 74 are formed separating the fins 72. Gate stacks 78 are formed over channel regions of the fins 72. Source/drain regions 82 are formed in the fins 72, adjacent the gate stacks 78. Although the gate spacers 76 are not shown in FIG. 4A, it should be appreciated that they are disposed between the gate stacks 78 and source/drain regions 82. Further, it should be appreciated that some features are omitted for clarity of illustration. For example, dummy gate stacks can be formed on the ends of the fins 72.

Six transistors are formed, which will be used to form the memory cell 60. The formed transistors include pull-up transistors PU1 and PU2, pull-down transistors PD1 and PD2, and pass-gate transistors PG1 and PG2. The first pull-up transistor PU1 includes a first gate stack 78A over a first channel region, a first source/drain region 82A, and a second source/drain region 82B. The second pull-up transistor PU2 includes a second gate stack 78B over a second channel region, a third source/drain region 82C, and a fourth source/drain region 82D. The first pull-down transistor PD1 includes the first gate stack 78A over a third channel region, a fifth source/drain region 82E, and a sixth source/drain region 82F. The second pull-down transistor PD2 includes the second gate stack 78B over a fourth channel region, a seventh source/drain region 82G, and an eighth source/drain region 82H. The first pass-gate transistor PG1 includes a third gate stack 78C over a fifth channel region, the sixth source/drain region 82F, and a ninth source/drain region 82I. The second pass-gate transistor PG2 includes a fourth gate stack 78D over a sixth channel region, a tenth source/drain region 82J, and the seventh source/drain region 82G.

Four fins 72 are formed, which will be used to form the six transistors. A first fin 72A is used to form the first pull-up transistor PU1. A second fin 72B is used to form the second pull-up transistor PU2. A third fin 72C is used to form the first pull-down transistor PD1 and the first pass-gate transistor PG1. A fourth fin 72D is used to form the second pull-down transistor PD2 and the second pass-gate transistor PG2. Because the pull-up transistors PU1 and PU2 are p-type devices, the fins 72A and 72B are formed in an n-type well region of the substrate 70. Likewise, because the pull-down transistors PD1 and PD2, and the pass-gate transistors PG1 and PG2 are n-type devices, the fins 72C and 72D are formed in p-type well regions of the substrate 70. The n-type well region is disposed between the p-type well regions.

Figure 5A:
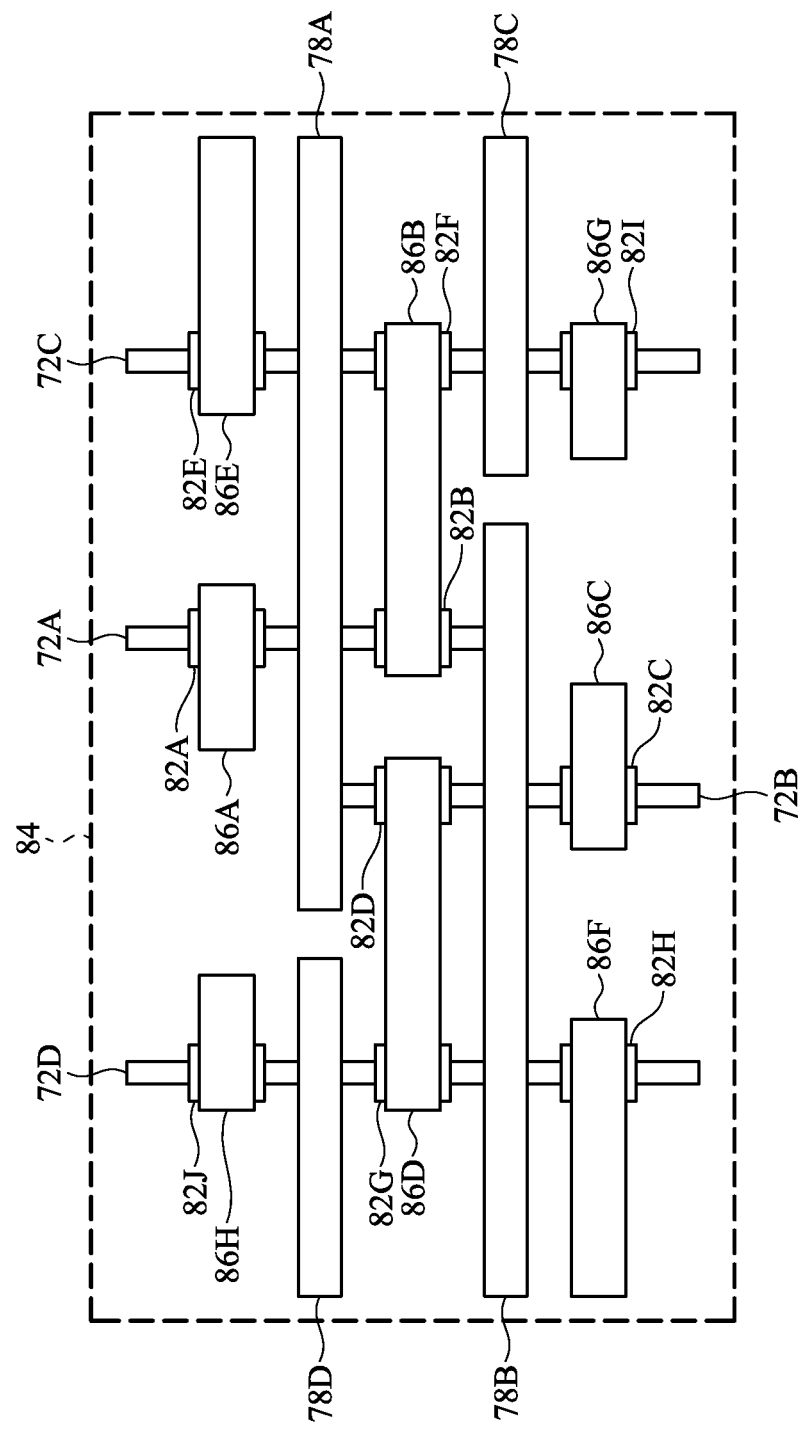
Figure 5B:
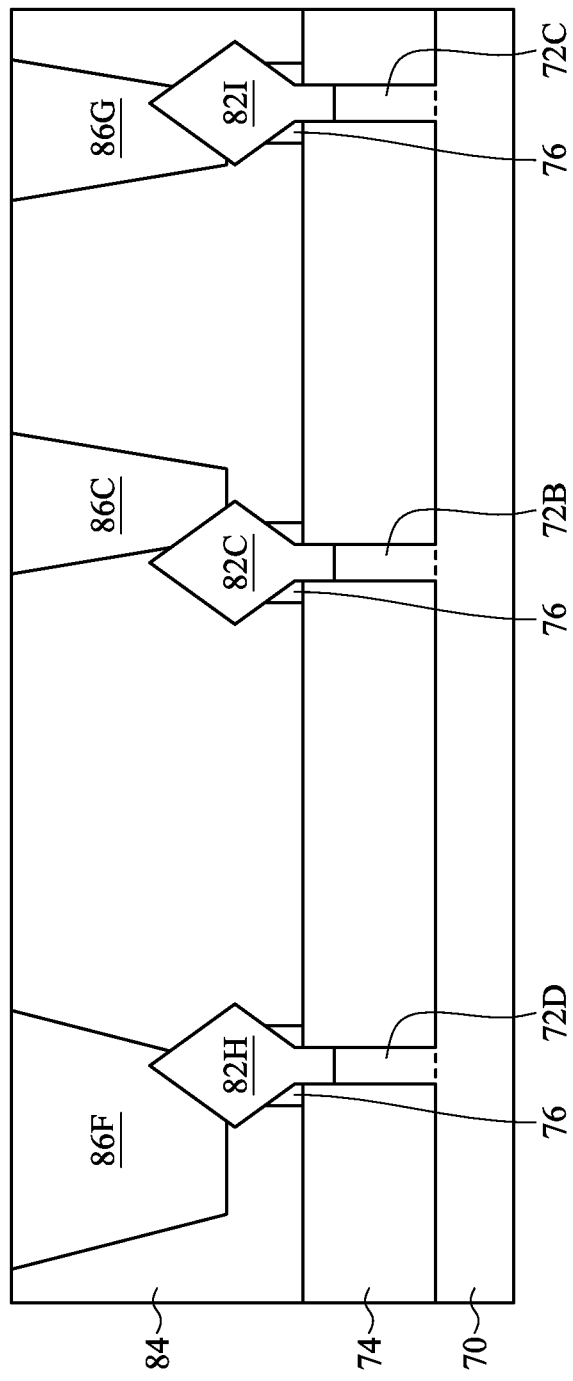

In FIGS. 5A and 5B, a dielectric layer 84 is formed over the source/drain regions 82 and STI regions 74. The dielectric layer 84 is illustrated as a transparent layer in FIG. 5A to better illustrate the features underlying the dielectric layer 84, such as the fins 72. The dielectric layer 84 may also be referred to as an inter-layer dielectric (ILD) layer. The dielectric layer 84 may be formed of any desired dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Source/drain contacts 86 are then formed through the dielectric layer 84 to physically and electrically couple the source/drain regions 82. Openings for the source/drain contacts 86 are formed through the dielectric layer 84. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the dielectric layer 84. The remaining liner and conductive material form the source/drain contacts 86 in the openings. An anneal process may be performed to form a silicide (not shown) at the interface between the source/drain regions 82 and the source/drain contacts 86.

Some of the source/drain contacts 86 span multiple source/drain regions 82, to thereby physically and electrically coupling the source/drain regions 82 of the respective transistors. Some of the source/drain contacts 86 physically and electrically couple a single source/drain region 82. A first source/drain contact 86A is coupled to the first source/drain region 82A. A second source/drain contact 86B is coupled to the second source/drain region 82B and sixth source/drain region 82F. A third source/drain contact 86C is coupled to the third source/drain region 82C. A fourth source/drain contact 86D is coupled to the fourth source/drain region 82D and seventh source/drain region 82G. A fifth source/drain contact 86E is coupled to the fifth source/drain region 82E. A sixth source/drain contact 86F is coupled to the eighth source/drain region 82H. A seventh source/drain contact 86G is coupled to the ninth source/drain region 82I. An eighth source/drain contact 86H is coupled to the tenth source/drain region 82J.

Figure 6A:
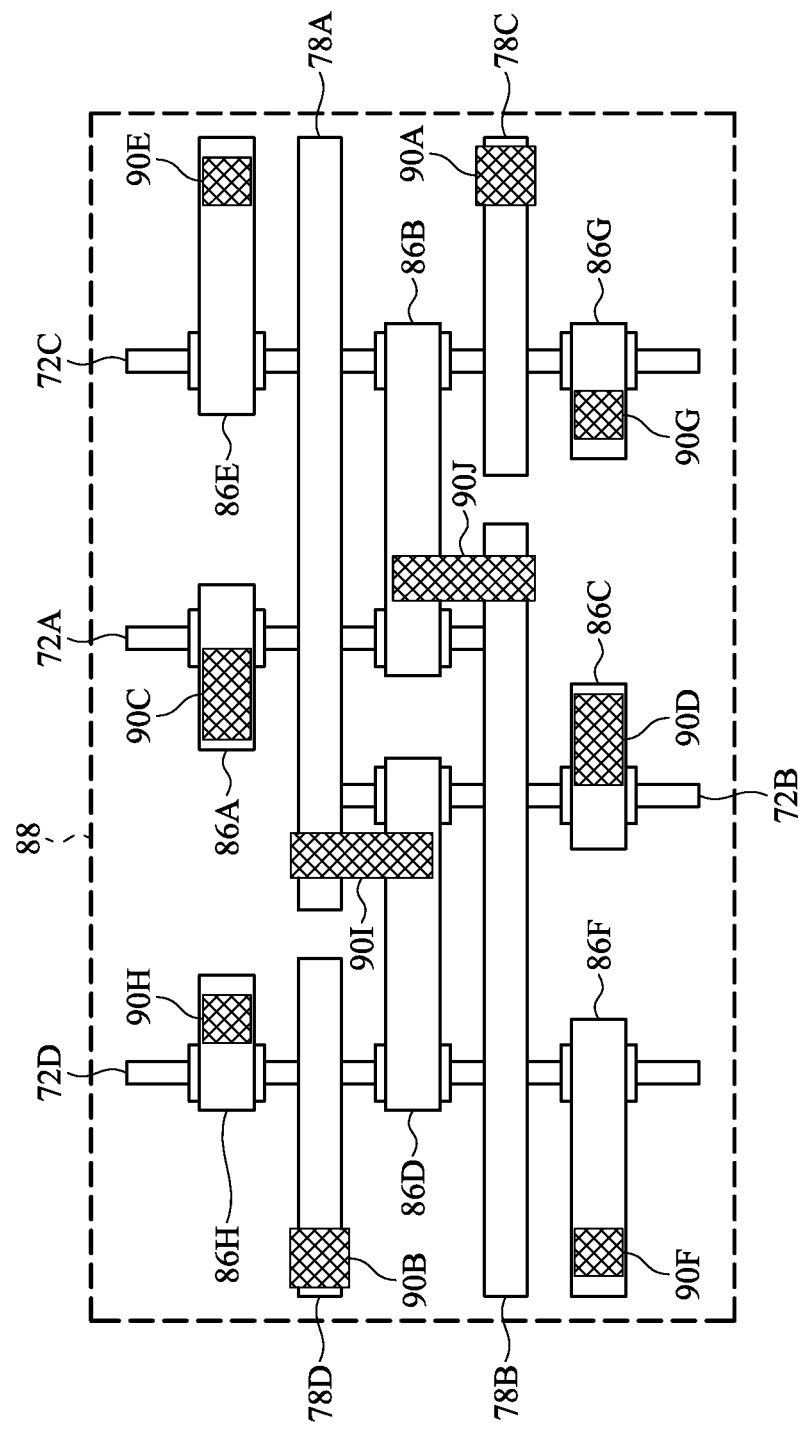
Figure 6B:
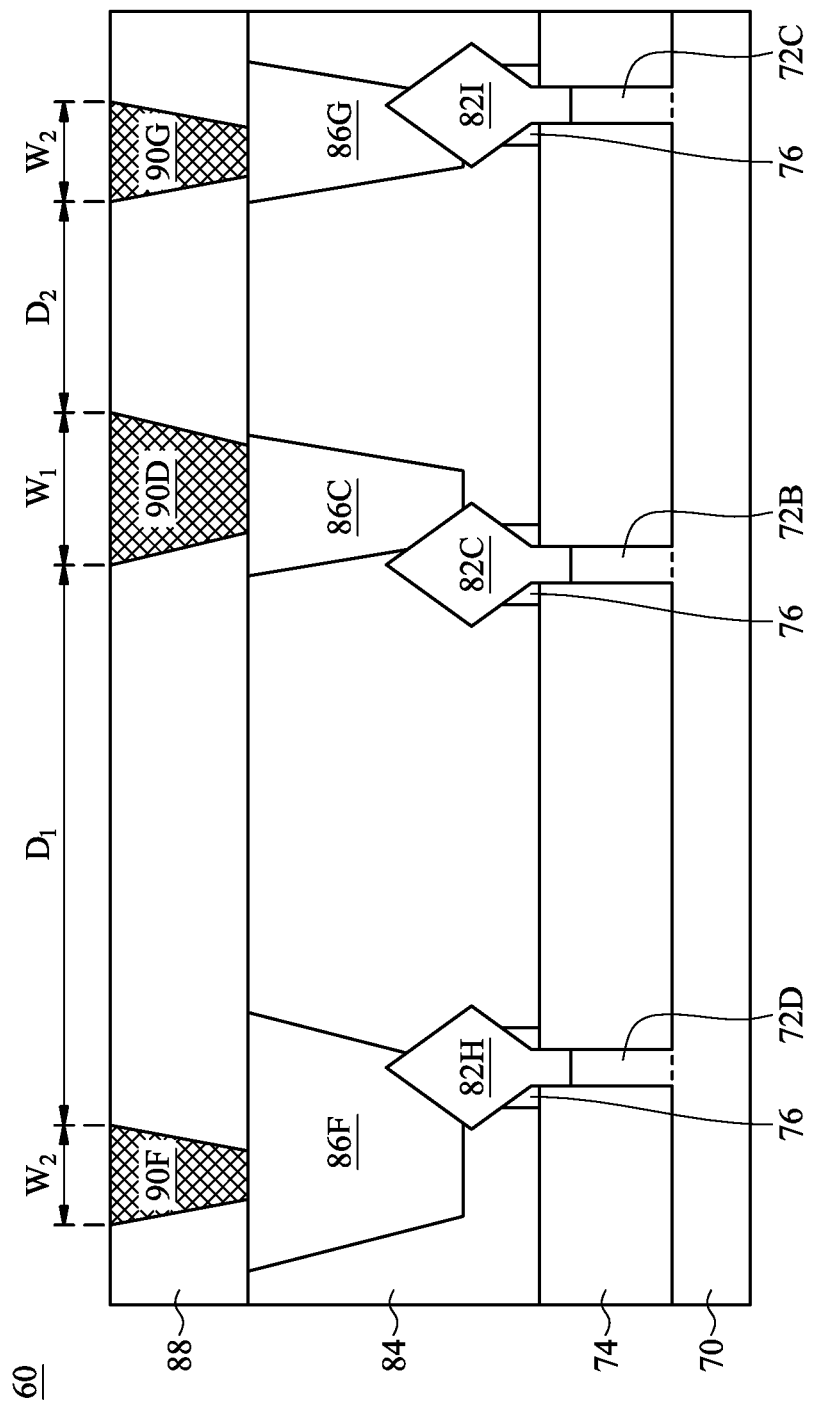

In FIGS. 6A and 6B, a dielectric layer 88 is deposited over the dielectric layer 84 and source/drain contacts 86. The dielectric layer 88 is illustrated as a transparent layer in FIG. 6A to better illustrate the features underlying the dielectric layer 88, such as the fins 72. The dielectric layer 88 may also be referred to as an ILD layer. In some embodiment, the dielectric layer 88 is a flowable film formed by a flowable CVD method. In some embodiments, the dielectric layer 88 is formed of a material such as PSG, BSG, BPSG, USG, or the like, and may be deposited by any suitable method, such as CVD and PECVD.

Conductive vias 90 are then formed through the dielectric layer 88 to couple the source/drain contacts 86 and gate stacks 78. Openings for the conductive vias 90 are formed through the dielectric layer 88. As an example to form the openings, a photoresist may be formed over the dielectric layer 88. The photoresist may be patterned with a pattern corresponding to the conductive vias 90. Patterning of the photoresist may be accomplished by the use of next-generation lithography techniques such as extreme ultraviolet (EUV) lithography, deep ultraviolet (DUV) lithography, X-ray lithography, soft X-ray (SX) lithography, ion beam projection lithography, electron-beam projection lithography, or the like. In an embodiment the etching process is accomplished by EUV lithography. The EUV lithography is performed by generating electromagnetic radiation in an atmosphere of $H_2$ plasma to produce an incident radiation beam having a wavelength in a desired range. The electromagnetic radiation may be generated with a plasma source such as xenon, oxygen, lithium, combinations thereof, or the like. A mask having the pattern of the conductive vias 90 patterns the incident radiation beam with a pattern that will be formed in the photoresist. The mask may be a transmissive mask, a reflective mask (sometimes referred to as a "reticle"), an optical proximity correction (OPC) mask, or the like. Optics, such as a projection optics box (POB), are then used to collect the patterned radiation beam, magnify or reduce the patterned radiation beam, and then project the patterned radiation beam on the photoresist, thereby patterning the photoresist with the pattern of the openings for the conductive vias 90. An etching process, such as a dry or wet etch, may then be performed to transfer the pattern of the photoresist to the dielectric layer 88. Diffusion barrier layers may be formed from TaN, Ta, TiN, Ti, CoW, or the like, and may be formed in the openings of the dielectric layer 88 by a deposition process such as ALD or the like. Conductive material such as copper, aluminum, tungsten, silver, and combinations thereof, or the like, is then formed over the diffusion barrier layers in the openings of the dielectric layer 88. The conductive material may be formed by an electrochemical plating process, CVD, ALD, PVD, the like, or a combination thereof. In an embodiment, the conductive material is copper, and the diffusion barrier layers are thin barrier layers that prevent the copper from diffusing into the dielectric layer 88. After formation of the diffusion barrier layers and the conductive material, excess conductive material and material of the diffusion barrier layers may be removed from the dielectric layer 88 by, for example, a planarization process such as CMP.

The conductive vias 90 include vias physically and electrically coupled to the gate stacks 78, vias physically and electrically coupled to the source/drain contacts 86, and vias physically and electrically coupled to both the gate stacks 78 and the source/drain contacts 86 (e.g., shared vias), which are used to cross-couple the inverters formed by the transistors PU1, PD1, PU2, and PD2. A first gate via 90A is coupled to the third gate stack 78C, and a second gate via 90B is coupled to the fourth gate stack 78D. A first source/drain via 90C is coupled to the first source/drain contact 86A, a second source/drain via 90D is coupled to the third source/drain contact 86C, a third source/drain via 90E is coupled to the fifth source/drain contact 86E, a fourth source/drain via 90F is coupled to the sixth source/drain contact 86F, a fifth source/drain via 90G is coupled to the seventh source/drain contact 86G, and a sixth source/drain via 90H is coupled to the eighth source/drain contact 86H. A first shared via 90I is coupled to the first gate stack 78A and fourth source/drain contact 86D, and a second shared via 90J is coupled to the second gate stack 78B and second source/drain contact 86B.

The conductive vias 90 are formed to dissimilar widths. As shown in FIG. 5A, the first source/drain region 82A and third source/drain region 82C are not aligned along a common longitudinal axis. Rather, the fins 72A and 72B have laterally offset longitudinal axes, and so the first source/drain region 82A and third source/drain region 82C are also laterally offset. In other words, the fins 72A and 72B have parallel longitudinal axes such that the longitudinal axes do not overlap. However, as discussed further below, the first source/drain region 82A and third source/drain region 82C will both be coupled to an overlying power supply voltage $V_{dd}$ line (see FIGS. 7A and 7B) to form the memory cell 60. To effect contact with the power supply voltage $V_{dd}$ line, the first source/drain via 90C and second source/drain via 90D are, respectively, formed near edge regions of the first source/drain contact 86A and third source/drain contact 86C. Further, the first source/drain via 90C and second source/drain via 90D are formed to a greater width than other ones of the conductive vias 90. Because the conductive vias 90 are formed by the use of next-generation lithography techniques, they may be formed to a small width. For example, the first source/drain via 90C and second source/drain via 90D are formed to a first width $W_1$, such as a first width $W_1$ in the range of about 15 nm to about 20 nm, and the other conductive vias 90A/90B/90E/90F/90G/90H/90I/90J are formed to a second width $W_2$, such as a second width $W_2$ in the range of about 10 nm to about 15 nm. The widths $W_1$ and $W_2$ are measured along a direction perpendicular to the longitudinal axes of the fins 72. The first width $W_1$ is greater than the second width $W_2$. As a result, the first source/drain via 90C and second source/drain via 90D may have a rectangular shape or oblong shape, and the other conductive vias 90A/90B/90E/90F/90G/90H/90I/90J may have a square shape or circular shape. Forming the first source/drain via 90C and second source/drain via 90D to a large width $W_1$ allows the contact area of the first source/drain via 90C and second source/drain via 90D to be increased even when the first source/drain via 90C and second source/drain via 90D are formed near edge regions of, respectively, the first source/drain contact 86A and third source/drain contact 86C. The contact resistance to the overlying power supply voltage $V_{dd}$ line may thus be lowered, increasing the pullup current for the pull-up transistors PU1 and PU2, thus improving performance of the memory cell 60. Further, the landing area for the first source/drain contact 86A and third source/drain contact 86C may be increased, increasing processing windows for the memory cell 60.

Because the conductive vias 90 are formed by the use of next-generation lithography techniques, they may be formed spaced apart by a small distance, as shown in FIG. 6B. For example, the second source/drain via 90D may be spaced apart from the fourth source/drain via 90F by a first distance $D_1$, such as a first distance $D_1$ in the range of about 70 nm to about 90 nm. Likewise, the second source/drain via 90D may be spaced apart from the fifth source/drain via 90G by a second distance $D_2$, such as a second distance $D_2$ in the range of about 45 nm to about 65 nm. Although not shown in FIG. 6B, the first source/drain via 90C and sixth source/drain via 90H may also be spaced apart by the second distance $D_2$, and the first source/drain via 90C and third source/drain via 90E may also be spaced apart by the first distance $D_1$. A small distance between conductive vias 90 allows for a greater density of memory cells 60.

Figure 7A:
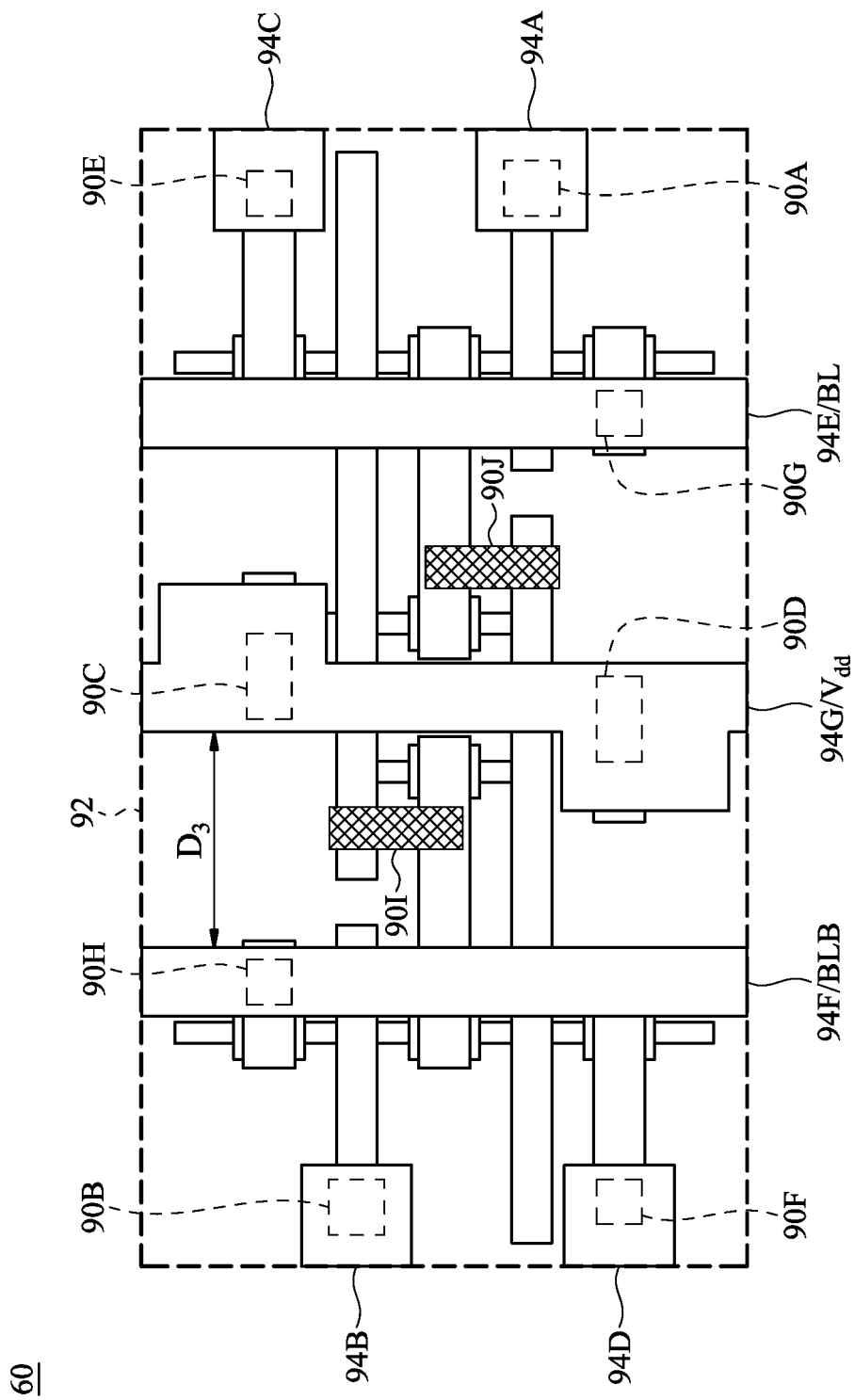
Figure 7B:
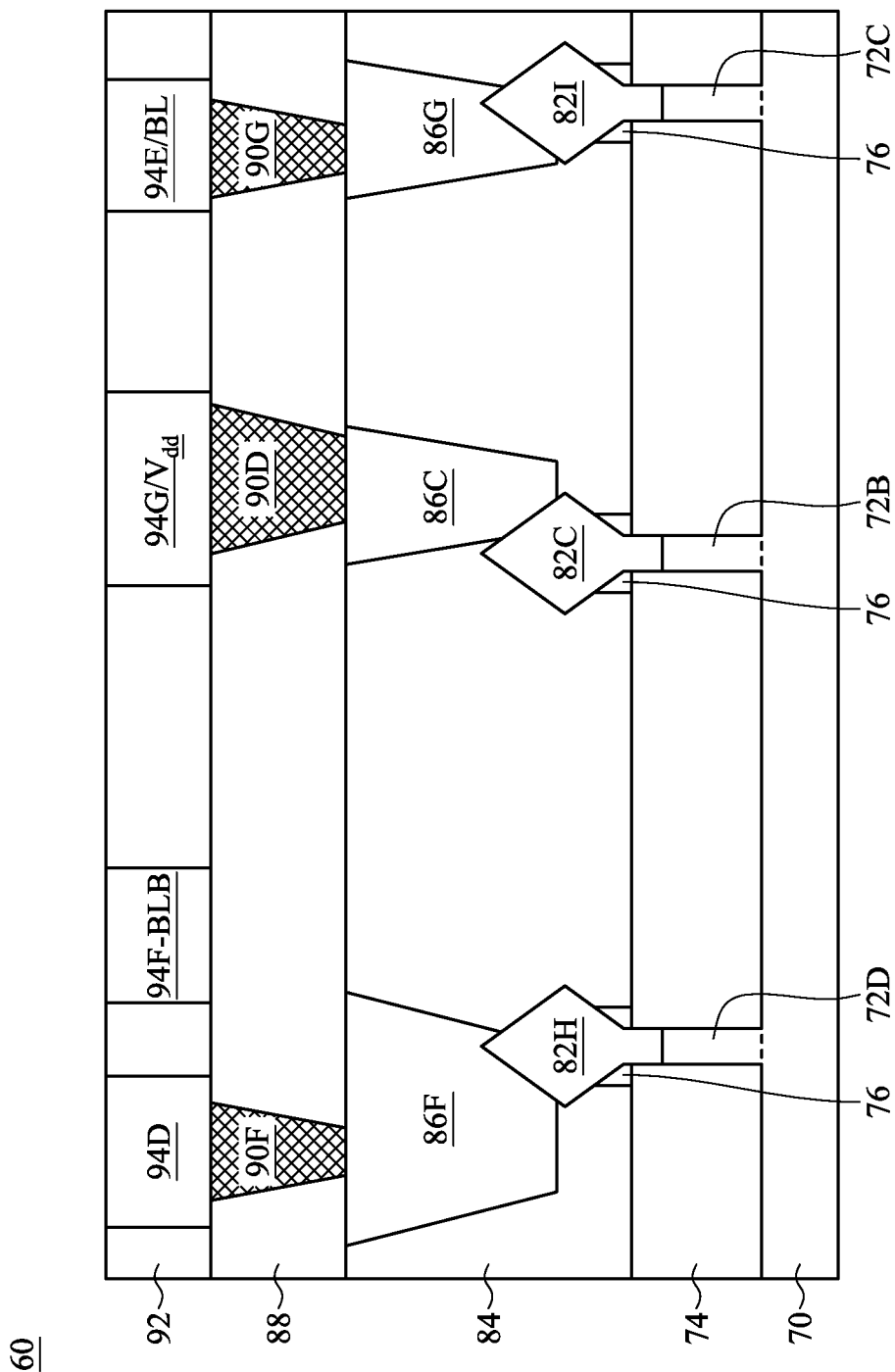

In FIGS. 7A and 7B, a dielectric layer 92 is deposited over the dielectric layer 88 and conductive vias 90. The dielectric layer 92 is illustrated as a transparent layer in FIG. 7A to better illustrate the features underlying the dielectric layer 92, such as the fins 72. The dielectric layer 92 may be referred to as an inter-metal dielectric (IMD) layer. The dielectric layer 92 may be a layer formed from a low-k dielectric material having a k-value lower than about 3.0. The dielectric layer 92 may be a layer formed from an extra-low-k (ELK) dielectric material having a k-value of less than 2.5. In some embodiments, the dielectric layer 92 may be formed from Black Diamond (a registered trademark of Applied Materials), an oxygen-containing and/or carbon containing low-k dielectric material, Hydrogen SilsesQuioxane (HSQ), MethylSilsesQuioxane (MSQ), or the like. In some embodiments, the dielectric layer 92 is formed from a porous material such as SiOCN, SiCN, SiOC, SiOCH, or the like, and may be formed by initially forming a precursor layer comprising a porogen, and then removing the porogen to form pores within the dielectric layer 92.

Conductive features 94 are then formed through the dielectric layer 92 to couple the conductive vias 90. Openings are formed in the dielectric layer 92 using, e.g., an etching process. As an example to form the openings, a photoresist may be formed over the dielectric layer 92. The photoresist may be patterned with a pattern corresponding to the conductive features 94. Patterning of the photoresist may be accomplished by the use of next-generation lithography techniques such as extreme ultraviolet (EUV) lithography, deep ultraviolet (DUV) lithography, X-ray lithography, soft X-ray (SX) lithography, ion beam projection lithography, electron-beam projection lithography, or the like. In an embodiment the etching process is accomplished by EUV lithography. The EUV lithography is performed by generating electromagnetic radiation in an atmosphere of $H_2$ plasma to produce an incident radiation beam having a wavelength in a desired range. The electromagnetic radiation may be generated with a plasma source such as xenon, oxygen, lithium, combinations thereof, or the like. A mask having the pattern of the conductive features 94 patterns the incident radiation beam with a pattern that will be formed in the photoresist. The mask may be a transmissive mask, a reflective mask (sometimes referred to as a "reticle"), an optical proximity correction (OPC) mask, or the like. Optics, such as a projection optics box (POB), are then used to collect the patterned radiation beam, magnify or reduce the patterned radiation beam, and then project the patterned radiation beam on the photoresist, thereby patterning the photoresist with the pattern of the openings for the conductive features 94. An etching process, such as a dry or wet etch, may then be performed to transfer the pattern of the photoresist to the dielectric layer 92. Diffusion barrier layers may be formed from TaN, Ta, TiN, Ti, CoW, or the like, and may be formed in the openings of the dielectric layer 92 by a deposition process such as ALD or the like. Conductive material such as copper, aluminum, tungsten, silver, and combinations thereof, or the like, is then formed over the diffusion barrier layers in the openings of the dielectric layer 92. The conductive material may be formed by an electrochemical plating process, CVD, ALD, PVD, the like, or a combination thereof. In an embodiment, the conductive material is copper, and the diffusion barrier layers are thin barrier layers that prevent the copper from diffusing into the dielectric layer 92. After formation of the diffusion barrier layers and the conductive material, excess conductive material and material of the diffusion barrier layers may be removed from the dielectric layer 92 by, for example, a planarization process such as CMP.

Because the conductive features 94 are formed by the use of next-generation lithography techniques, they may be formed spaced apart by a small distance, as shown in FIG. 7A. For example, the conductive features 94 may be spaced apart by a third distance $D_3$, such as a third distance $D_3$ in the range of about 35 nm to about 55 nm. A small distance between conductive features 94 allows for a greater density of memory cells 60.

The conductive features 94 include metal pads and metal lines that are physically and electrically coupled the conductive vias 90. A first metal pad 94A is coupled to the first gate via 90A, and a second metal pad 94B is coupled to the second gate via 90B. The first metal pad 94A and second metal pad 94B will be coupled to overlying word lines WL (see FIGS. 9A and 9B) for the memory cell 60. A third metal pad 94C is coupled to the third source/drain via 90E and a fourth metal pad 94D is coupled to the fourth source/drain via 90F. The third metal pad 94C and fourth metal pad 94D will be coupled overlying ground voltage $V_{ss}$ lines (see FIGS. 9A and 9B) for the memory cell 60. A first metal line 94E is coupled to the fifth source/drain via 90G, and a second metal line 94F is coupled to the sixth source/drain via 90H. The first metal line 94E is the bitline BL (see FIG. 2) for the memory cell 60, and the second metal line 94F is the inverted bitline BLB (see FIG. 2) for the memory cell 60, and both will be coupled (discussed further below) to the column decoder 58 and read/write circuit 56. A third metal line 94G is coupled to the first source/drain via 90C and second source/drain via 90D. The third metal line 94G is the power supply voltage $V_{dd}$ line (see FIG. 2) for the memory cell 60. The first metal line 94E, second metal line 94F, and third metal line 94G extend through one or more of memory cells 60 in a column of the memory cell array 52 (see FIG. 1).

Figure 7C:
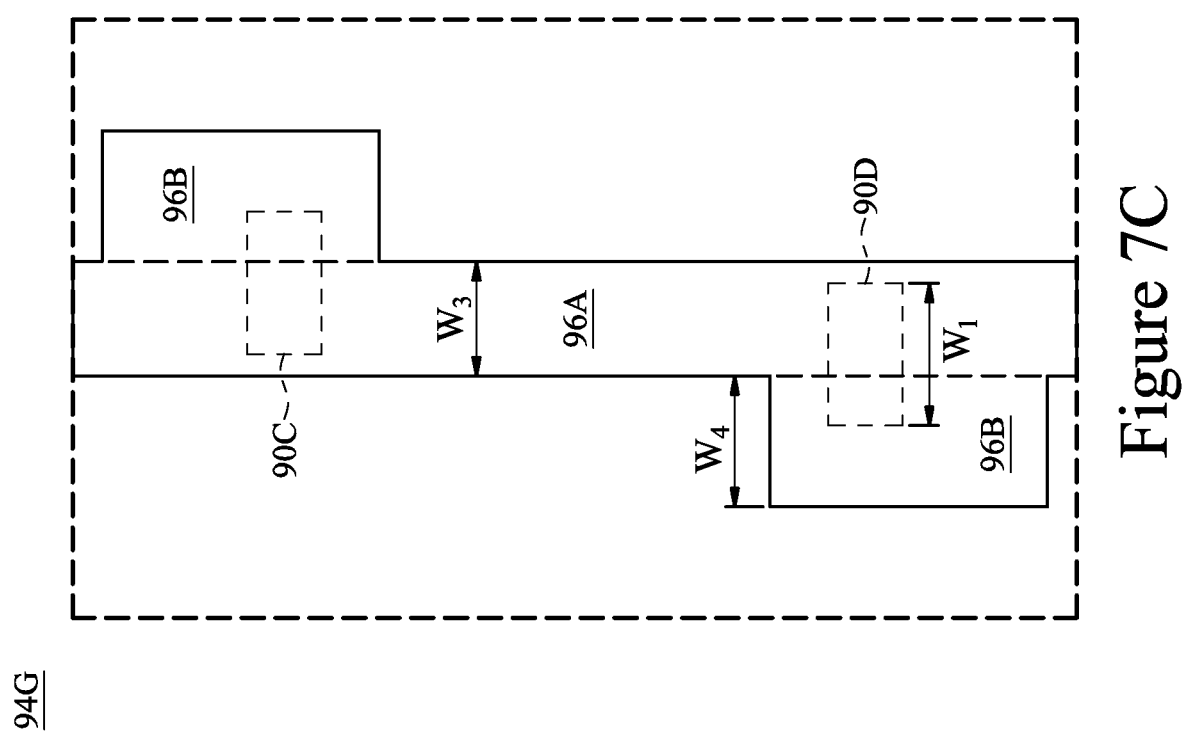

FIG. 7C is a detailed view of the third metal line 94G (e.g., the power supply voltage $V_{dd}$ line), showing additional features. As noted above, the etching process for forming the third metal line 94G may be accomplished by EUV lithography. EUV lithography allows the dielectric layer 92 to be patterned by a single-patterning photolithography process, instead of by a multiple-patterning photolithography process with immersion lithography. The conductive features 94, and in particular the third metal line 94G, may thus have arbitrary shapes and very small dimensions. For example, the third metal line 94G may be formed in shapes other than a straight line. In particular, the third metal line 94G is formed to include a main portion 96A and pad portions 96B. The main portion 96A has a longitudinal axis that is parallel to the longitudinal axes of the fins 72A and 72B. Further, the main portion 96A is laterally disposed between the fins 72A and 72B in the schematic view. Each of the pad portions 96B is a process of the main portion 96A (e.g., is a projection extending from the main portion 96A), with each memory cell 60 containing a pair of pad portions 96B extending from opposing sides of the main portion 96A. As noted above, the third metal line 94G (e.g., the power supply voltage $V_{dd}$ line) is formed to couple the first source/drain region 82A and third source/drain region 82C, which are not aligned along a common longitudinal axis. The pad portions 96B are over, and physically and electrically couple, the first source/drain via 90C and second source/drain via 90D, thereby allowing the third metal line 94G to couple the first source/drain region 82A and third source/drain region 82C, even when the first source/drain region 82A and third source/drain region 82C are not aligned along a common longitudinal axis. Some portions of the first source/drain via 90C and second source/drain via 90D may also physically and electrically couple the main portion 96A, but a majority of the first source/drain via 90C and second source/drain via 90D physically and electrically couple the pad portions 96B.

Thus, although the main portion 96A may not overly the first source/drain via 90C and second source/drain via 90D, the pad portions 96B allow the third metal line 94G to overly the first source/drain via 90C and second source/drain via 90D. Further, forming the conductive features 94 by EUV lithography allows the conductive features 94 to be formed with very small widths. For example, the main portion 96A of the third metal line 94G may have a third width $W_3$ in the range of about 10 nm to about 18 nm, and the pad portions 96B of the third metal line 94G may have a fourth width $W_4$ in the range of about 5 nm to about 15 nm. Both the third width $W_3$ and the fourth width $W_4$ may be less than the first width $W_1$. Further, the third width $W_3$ may be greater than the fourth width $W_4$.

Figure 8A:
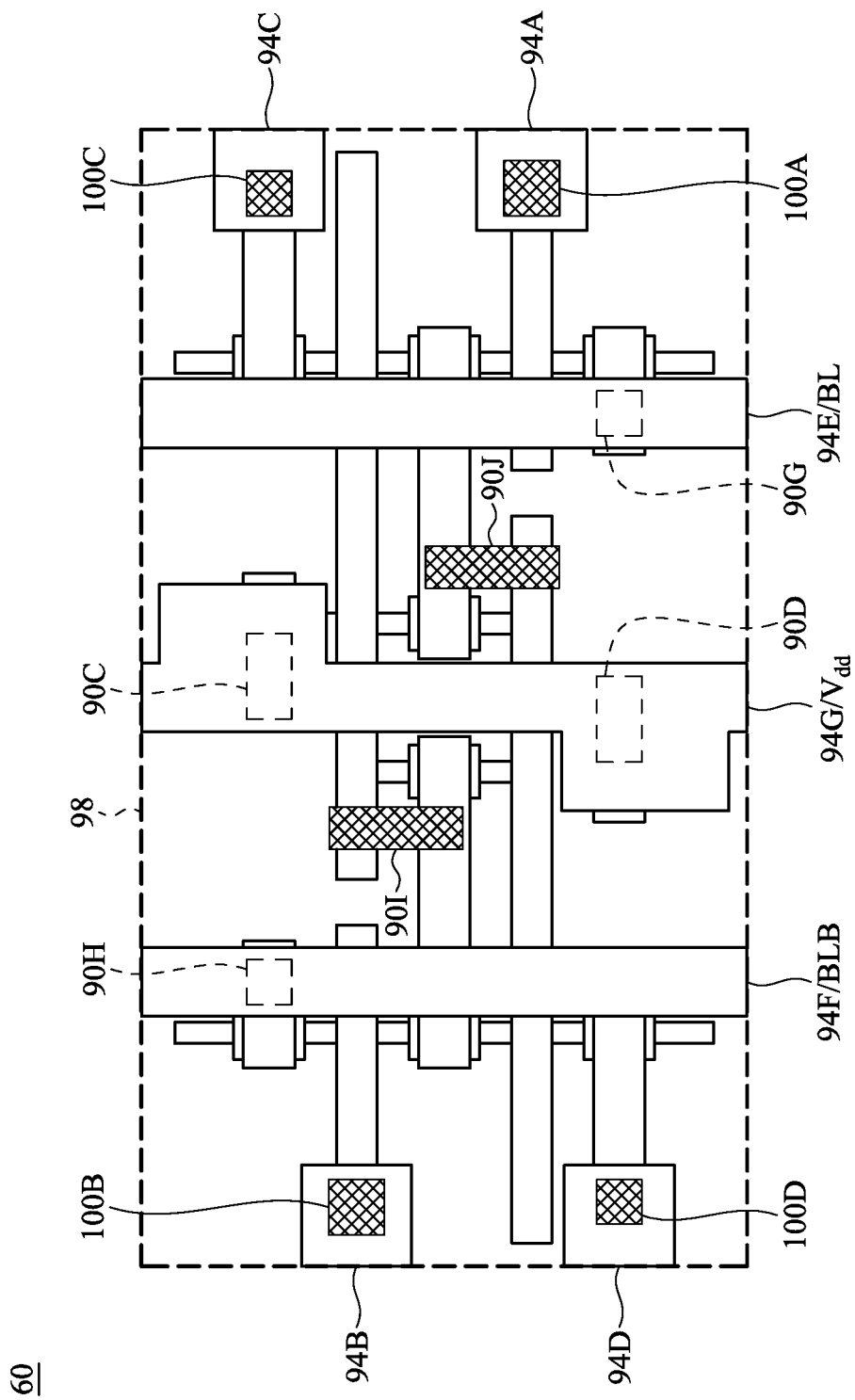
Figure 8B:
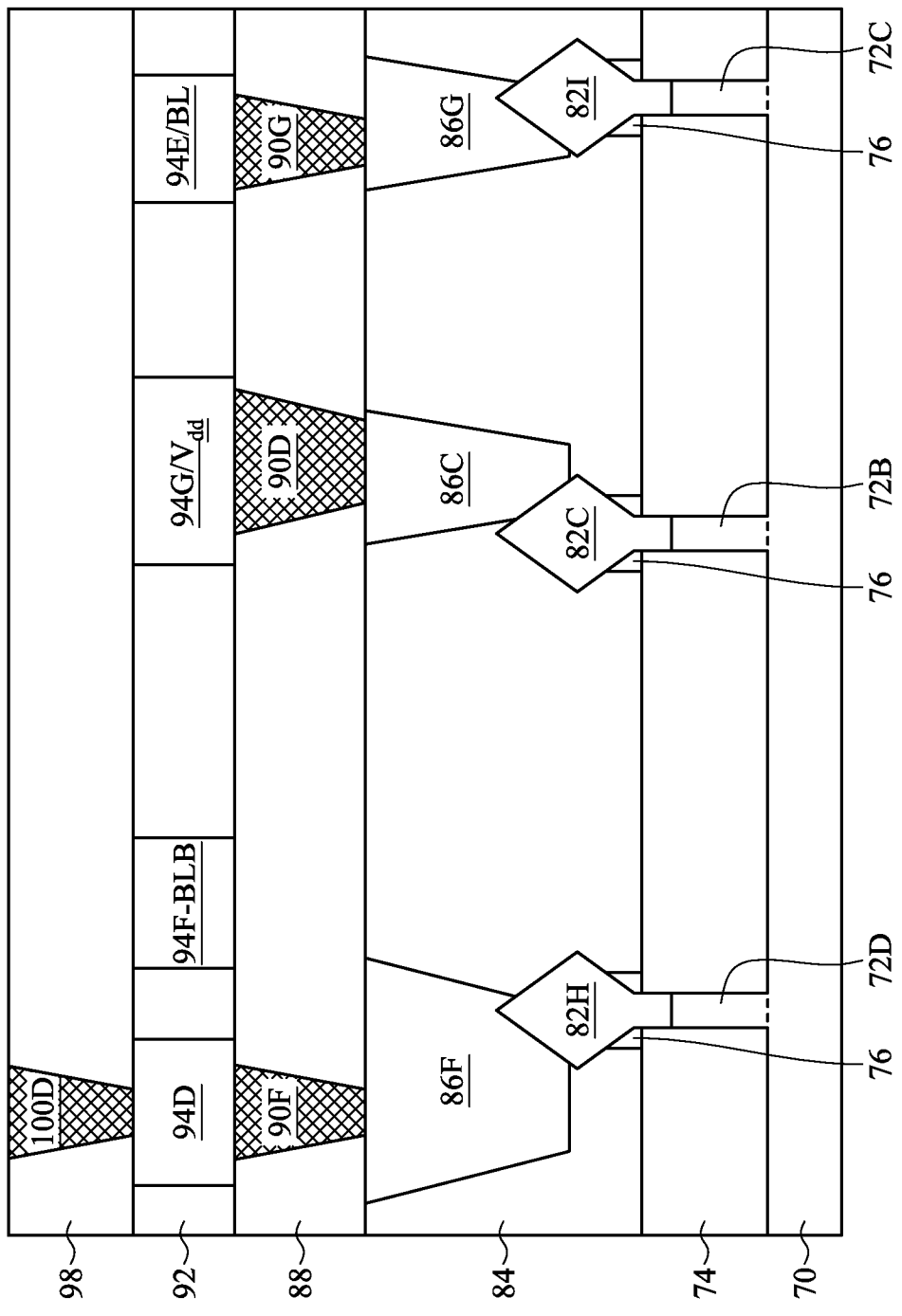

In FIGS. 8A and 8B, a dielectric layer 98 is deposited over the dielectric layer 92 and conductive features 94. The dielectric layer 98 is illustrated as a transparent layer in FIG. 8A to better illustrate the features underlying the dielectric layer 98, such as the fins 72. The dielectric layer 98 may be referred to as an IMD layer. The dielectric layer 98 may be formed in a similar manner and of a similar material as the dielectric layer 92. Conductive vias 100 are then formed through the dielectric layer 98 to physically and electrically couple the conductive features 94. The conductive vias 100 may be formed in a similar manner and of a similar material as the conductive vias 90. A first conductive via 100A is coupled to the first metal pad 94A, and a second conductive via 100B is coupled to the second metal pad 94B. The first conductive via 100A and second conductive via 100B will be coupled to overlying word lines WL (see FIGS. 9A and 9B) for the memory cell 60. A third conductive via 100C is coupled to the third metal pad 94C, and a fourth conductive via 100D is coupled to the fourth metal pad 94D. The third conductive via 100C and fourth conductive via 100D will be coupled to an overlying ground voltage $V_{ss}$ line (see FIGS. 9A and 9B) for the memory cell 60.

Figure 9A:
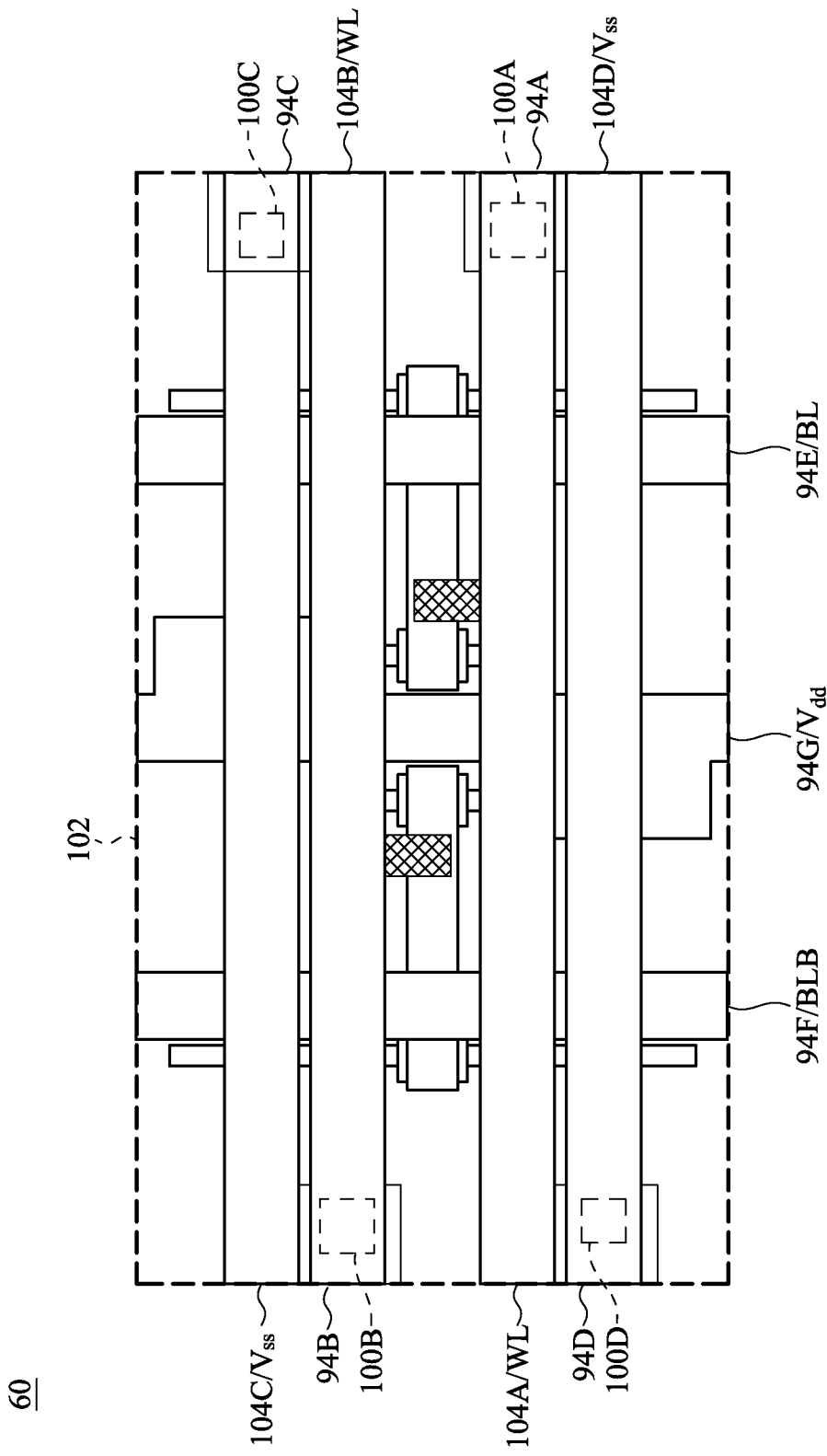
Figure 9B:
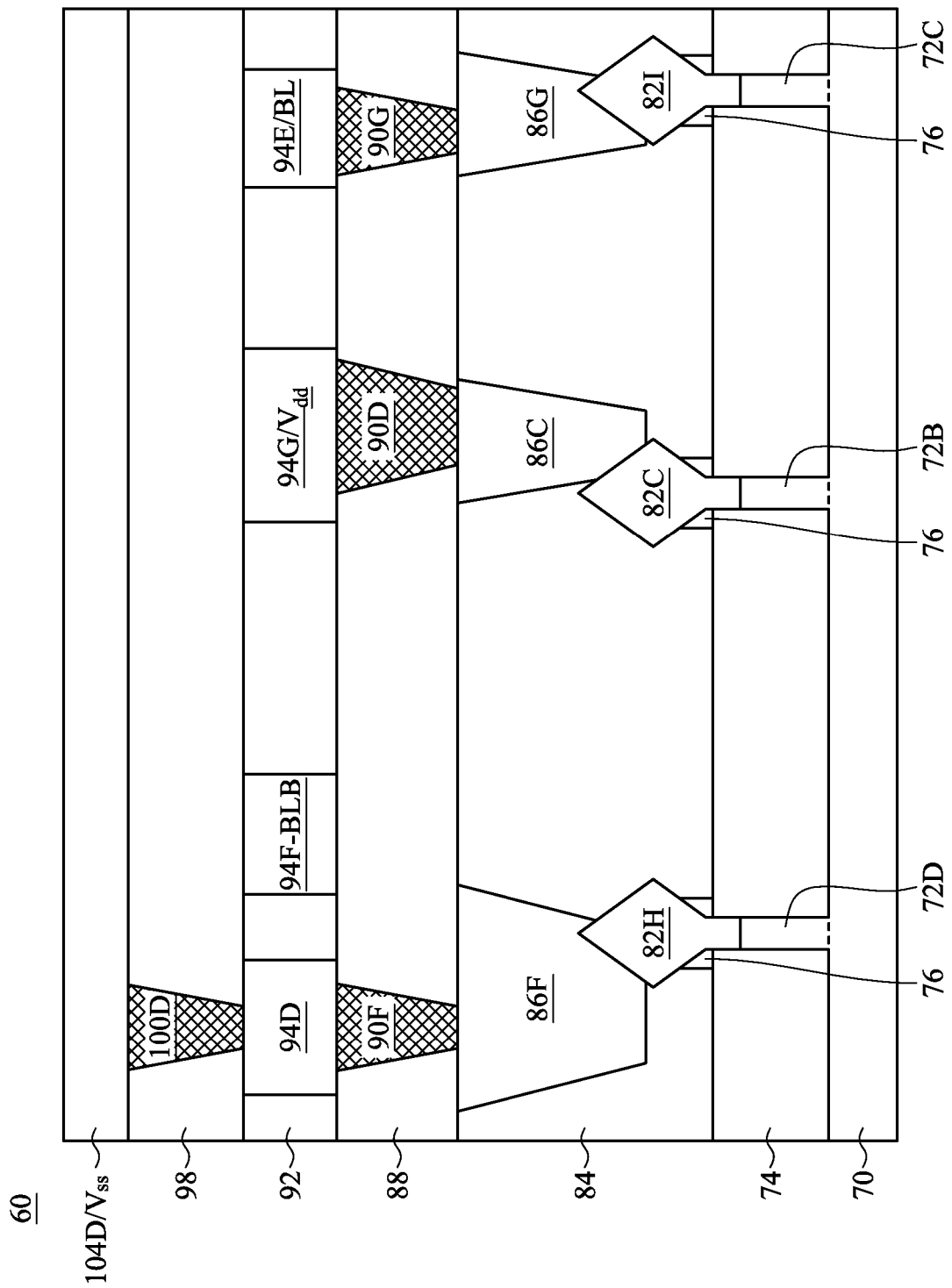

In FIGS. 9A and 9B, a dielectric layer 102 is deposited over the dielectric layer 98. The dielectric layer 102 is illustrated as a transparent layer in FIG. 9A to better illustrate the features underlying the dielectric layer 102, such as the fins 72. The dielectric layer 102 may be referred to as an IMD layer. The dielectric layer 102 may be formed in a similar manner and of a similar material as the dielectric layer 92. Conductive features 104 are then formed through the dielectric layer 102 to couple the conductive vias 100. The conductive features 104 may be formed in a similar manner and of a similar material as the conductive features 94. The conductive features 104 include metal lines that are that are physically and electrically coupled the conductive vias 100. A first metal line 104A and a second metal line 104B are, respectively, coupled to the first metal pad 94A and second metal pad 94B. The first metal line 104A and second metal line 104B are each word lines WL (see FIG. 2) for the memory cell 60, and are coupled to the row decoder 54. A third metal line 104C and a fourth metal line 104D are, respectively, coupled to the third metal pad 94C and fourth metal pad 94D. The third metal line 104C and fourth metal line 104D are each a ground voltage $V_{ss}$ line (see FIG. 2) for the memory cell 60.

Although the process for forming the memory cell 60 is described as a single damascene process, it should be appreciated that other processes may be used, and some layers may be duplicated or omitted, depending on the process used. For example, other damascene processes, such as a dual damascene process, may also be used. When a dual damascene process is used, the dielectric layers 88 and 92 may be a single dielectric layer, and the conductive vias 90 and conductive features 94 may be formed through the single dielectric layer in a single plating process. Likewise, the dielectric layers 98 and 102 may also be a single dielectric layer, and the conductive vias 100 and conductive features 104 may be formed through the single dielectric layer in a single plating process. Further, it should be appreciated that some layers are omitted for illustration clarity. For example, one or more etch stop layers (ESLs) may be formed between each of the dielectric layers 84, 88, 92, 98, and 102.

Figure 10:
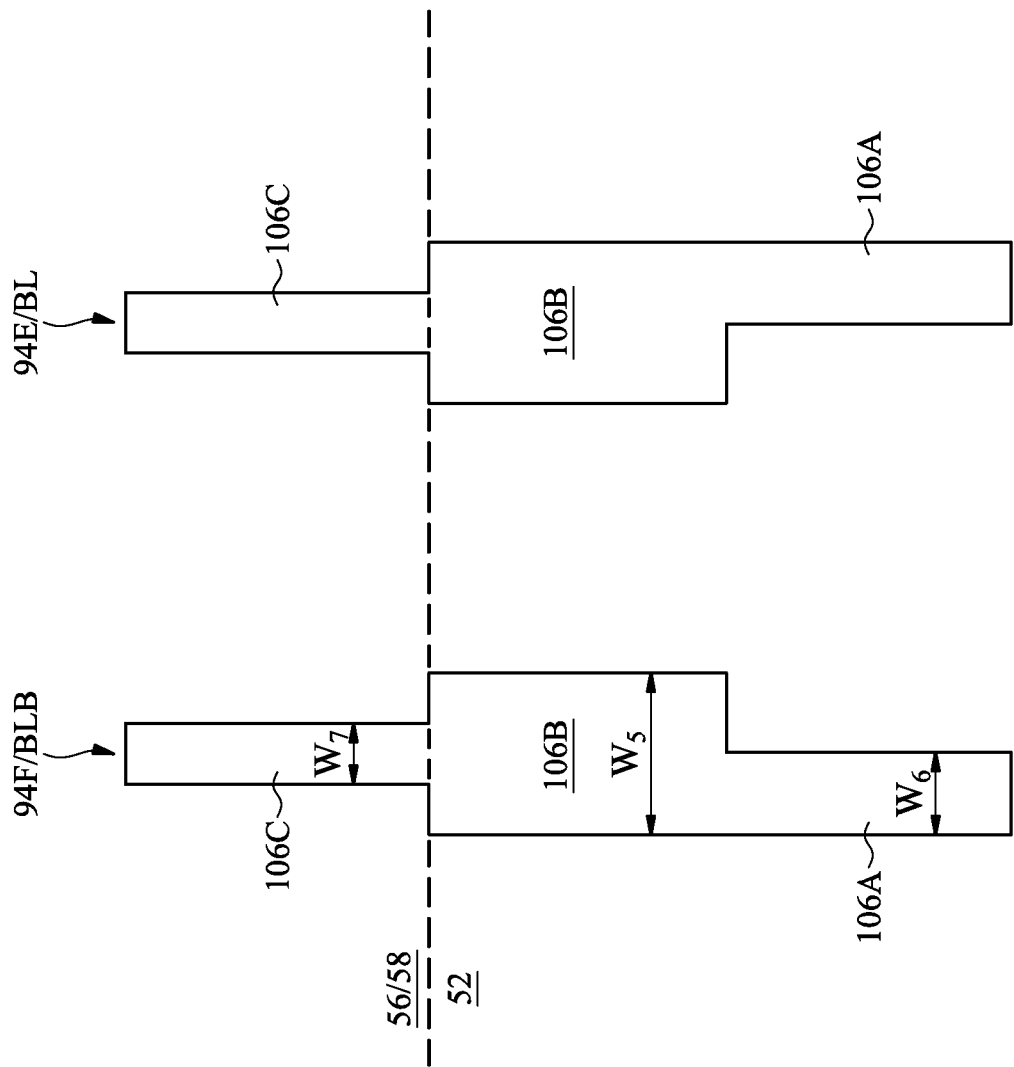
FIG. 10 illustrates a schematic view of metal lines, in accordance with some embodiments.
Figure 11:
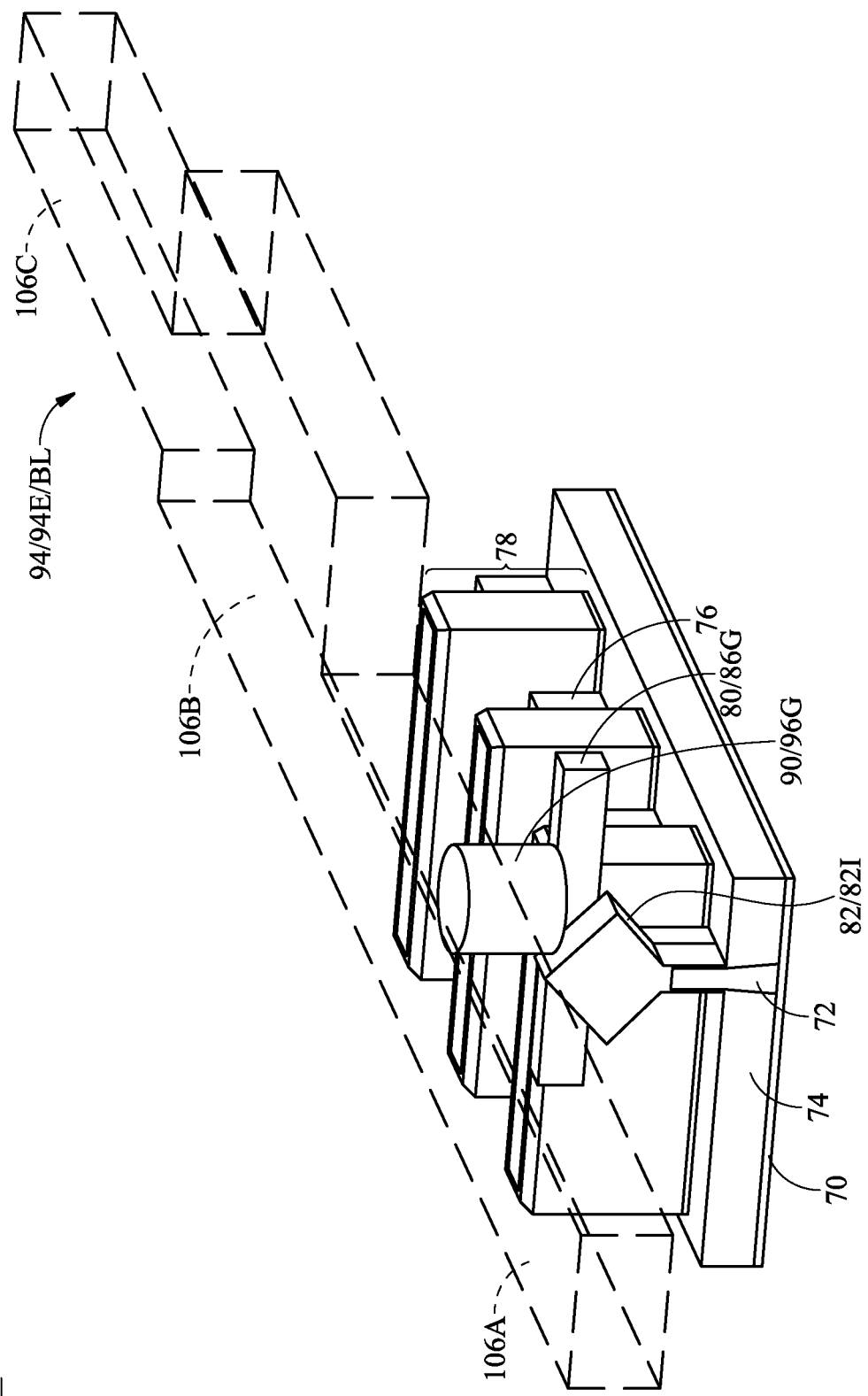
FIG. 11 illustrates a simplified three-dimensional view of a memory, in accordance with some embodiments.

As noted above, the etching process for forming the conductive features 94 may be accomplished by EUV lithography, allowing the conductive features 94 to be formed with arbitrary shapes and very small dimensions. Although the third metal line 94G (described above with respect to FIG. 7C) is described as having an arbitrary shape, other conductive features 94 may also have arbitrary shapes. FIG. 10 illustrates a schematic view of the first metal line 94E and second metal line 94F, in accordance with some embodiments. The first metal line 94E and second metal line 94F may also be formed in shapes other than straight lines, which may help with metal line routing. In particular, the first metal line 94E and second metal line 94F may each be formed to include a main portion 106A, a pad portion 106B, and a periphery portion 106C. The pad portions 106B connect the main portions 106A to the periphery portions 106C. The main portions 106A extend through one or more memory cells 60, and correspond to the complimentary bitlines BL and BLB. The pad portions 106B are disposed at the edge of the memory cell array 52, and one or more main portions 106A are connected to each of the pad portions 106B. The periphery portions 106C connect the pad portions 106B to a periphery circuit, such as the read/write circuit 56 and/or column decoder 58 for the memory 50. The pad portions 106B have larger widths $W_5$ than the widths $W_6$ of the main portions 106A and the widths $W_7$ of the periphery portions 106C. For example, the width $W_5$ can be in the range of about 40 nm to about 80 nm, the width $W_6$ can be in the range of about 20 nm to about 30 nm, and the width $W_7$ can be in the range of about 15 nm to about 25 nm. The main portion 106A, pad portion 106B, and periphery portion 106C for each of the first metal line 94E and second metal line 94F are disposed in a same dielectric layer, such as in the dielectric layer 92 (see FIGS. 9A and 9B). Metal line routing of the complimentary bitlines BL and BLB to the periphery circuit, such as the read/write circuit 56 and/or column decoder 58, may thus be performed in a same layer. FIG. 11 illustrates a simplified three-dimensional view of the memory 50, showing the first metal line 94E. As shown, forming the first metal line 94E with a pad portion 106B allows signal routing between the memory cell array 52 and a periphery circuit, such as the read/write circuit 56 and/or the column decoder 58, to be performed in the same layer. Manufacturing costs of the memory 50 may thus be reduced.

Figure 12:
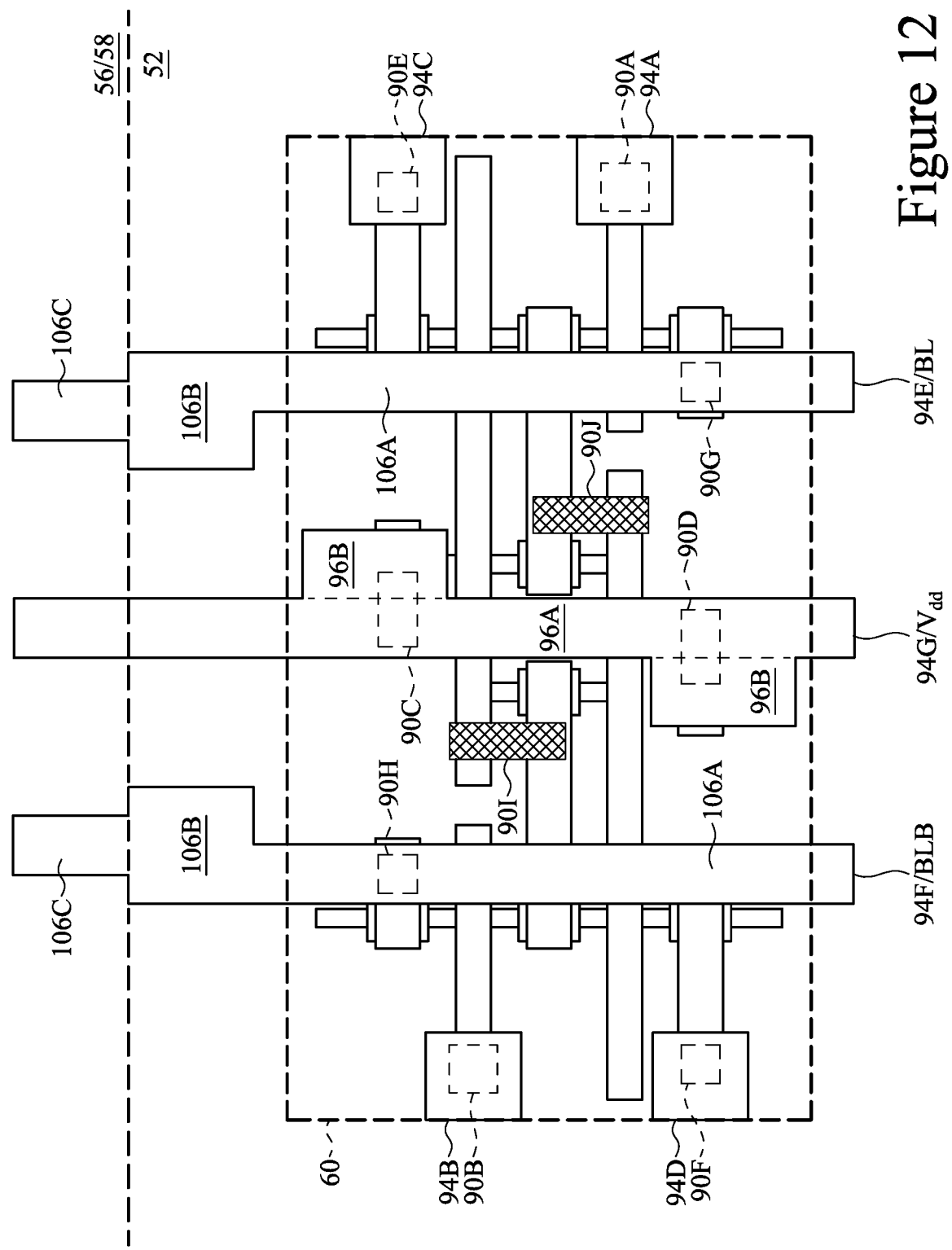
FIG. 12 illustrates a schematic view of a memory, in accordance with some embodiments.

FIG. 12 illustrates a schematic view of the memory 50, in accordance with some embodiments. FIG. 12 shows one memory cell 60, and also shows additional details of the metal lines 94E/94F/94G. The metal lines 94E/94F/94G connect the memory cells 60 of the memory cell array 52 to the read/write circuit 56 and/or column decoder 58 for the memory 50. As shown, the first metal line 94E and second metal line 94F have main portions 106A, pad portions 106B, and periphery portions 106C. Further, the third metal line 94G has a main portion 96A and pad portions 96B. The main portions 96A and 106A have parallel longitudinal axes.

Although the memory cell 60 is described as a SRAM cell, it should be appreciated that embodiments may be applied to other types of memories. For example, metal lines with arbitrary shapes may also be used to form interconnects for dynamic random-access memory (DRAM) cells, resistive random-access memory (RRAM) cells, magnetoresistive random-access memory (MRAM) cells, or the like. Further, embodiments may be applied to other types of devices. For example, metal lines with arbitrary shapes may also be used to form logic devices, application-specific integrated circuits, or the like.

Embodiments may achieve advantages. Forming the openings for the conductive features 94 by EUV lithography allows the conductive features 94 to be formed with arbitrary shapes and very small dimensions. The third metal line 94G may thus be formed with pad portions 96B for coupling to the first source/drain via 90C and second source/drain via 90D. The widths of the first source/drain via 90C and second source/drain via 90D may thus be increased, thereby allowing the landing area for the first source/drain contact 86A and third source/drain contact 86C to be increased. The contact resistance to the third metal line 94G line may thus be lowered, increasing the pullup current for the pull-up transistors PU1 and PU2 and improving performance of the memory cell 60. Further, the first metal line 94E and second metal line 94F may also be formed with pad portions 106B for coupling multiple main portions 106A. Routing of the first metal line 94E and second metal line 94F may thus also be improved.

In an embodiment, a device includes: a substrate having a first p-type well region, a second p-type well region, and a n-type well region disposed between the first p-type well region and the second p-type well region; a first pull-up transistor in the n-type well region, the first pull-up transistor including a first source/drain region; a second pull-up transistor in the n-type well region, the second pull-up transistor including a second source/drain region; and a first conductive feature electrically connected to a power supply voltage node, the first conductive feature having a main portion, a first pad portion extending from a first side of the main portion, and a second pad portion extending from a second side of the main portion, the first pad portion being over and electrically connected to the first source/drain region of the first pull-up transistor, the second pad portion being over and electrically connected to the second source/drain region of the second pull-up transistor, the first pad portion and the second pad portion each having a first width, the main portion having a second width, the first width being less than the second width.

In some embodiments, the device further includes: a first pass-gate transistor in the first p-type well region, the first pass-gate transistor including a third source/drain region; a second pass-gate transistor in the second p-type well region, the second pass-gate transistor including a fourth source/drain region; a second conductive feature over and electrically connected to the third source/drain region of the first pass-gate transistor; a third conductive feature over and electrically connected to the fourth source/drain region of the second pass-gate transistor; and a first dielectric layer surrounding each of the first conductive feature, the second conductive feature, and the third conductive feature. In some embodiments of the device, the first pass-gate transistor further includes a first gate, the second pass-gate transistor further includes a second gate, and the device further includes: a fourth conductive feature over and electrically connected to the first gate; a fifth conductive feature over and electrically connected to the second gate; a first pull-down transistor in the first p-type well region, the first pull-down transistor including a fifth source/drain region; a second pull-down transistor in the second p-type well region, the second pull-down transistor including a sixth source/drain region; a sixth conductive feature electrically connected to a ground voltage node, the sixth conductive feature being over and electrically connected to the fifth source/drain region of the first pull-down transistor; a seventh conductive feature electrically connected to the ground voltage node, the seventh conductive feature being over and electrically connected to the sixth source/drain region of the second pull-down transistor; and a second dielectric layer surrounding each of the fourth conductive feature, the fifth conductive feature, the sixth conductive feature, and the seventh conductive feature. In some embodiments, the device further includes: a first via electrically connecting the first conductive feature to the first source/drain region, the first via having a third width; and a second via electrically connecting the sixth conductive feature to the fifth source/drain region, the second via having a fourth width, the third width being greater than the fourth width. In some embodiments of the device, the first via is separated from the second via by a first distance, the first distance being in a range of 70 nm to 90 nm. In some embodiments, the device further includes: a row decoder electrically connected to each of the fourth conductive feature and the fifth conductive feature. In some embodiments, the device further includes: a column decoder electrically connected to each of the second conductive feature and the third conductive feature. In some embodiments of the device, the second conductive feature and the third conductive feature each have a main portion, a pad portion, and a periphery portion, the pad portion connecting the main portion to the periphery portion, the periphery portion being connected to the column decoder, where the main portion, the pad portion, and the periphery portion are each disposed in the first dielectric layer. In some embodiments, the device further includes: a first fin in the n-type well region, the first fin including the first pull-up transistor, the first fin disposed along a first longitudinal axis; and a second fin in the n-type well region, the second fin including the second pull-up transistor, the second fin disposed along a second longitudinal axis, the second longitudinal axis being different from the first longitudinal axis, where the main portion of the first conductive feature is disposed along a third longitudinal axis, the third longitudinal axis being laterally disposed between the first longitudinal axis and the second longitudinal axis.

In an embodiment, a device includes: a substrate having a first p-type well region, a second p-type well region, and a n-type well region disposed between the first p-type well region and the second p-type well region; a first pull-up transistor in the n-type well region, the first pull-up transistor including a first source/drain region; a first pull-down transistor in the first p-type well region, the first pull-down transistor including a second source/drain region; a first via electrically connected to the first source/drain region of the first pull-up transistor, the first via having a first width; and a second via electrically connected to the second source/drain region of the first pull-down transistor, the second via having a second width, the first width being greater than the second width, the first width and the second width each being measured along a same direction, where the first via is separated from the second via by a first distance, the first distance being in a range of 70 nm to 90 nm.

In some embodiments, the device further includes: a first dielectric layer over the first via and the second via; and a metal line in the first dielectric layer, the metal line having a main portion, and a first projecting portion laterally extending from the main portion, the first via being physically and electrically connected to the first projecting portion and the main portion. In some embodiments of the device, the main portion of the metal line has a third width, the third width being less than the first width. In some embodiments of the device, the first projecting portion of the metal line has a fourth width, the fourth width being less than the first width. In some embodiments of the device, the third width is greater than the fourth width. In some embodiments, the device further includes: a first fin including the first pull-up transistor; and a second fin including the first pull-down transistor, where the first fin, the second fin, and the main portion of the metal line are parallel. In some embodiments of the device, the main portion of the metal line does not laterally overlap with the first fin or the second fin.

In an embodiment, a method includes: forming a first fin extending from an n-type well region of a substrate; growing a first source/drain region in the first fin; forming a second fin extending from the n-type well region of the substrate; growing a second source/drain region in the second fin; depositing a first dielectric layer over the first source/drain region and the second source/drain region; forming a first via through the first dielectric layer to electrically couple the first source/drain region, the first via having a width in a range of 15 nm to 20 nm; forming a second via through the first dielectric layer to electrically couple the second source/drain region, the second via having a width in a range of 15 nm to 20 nm; depositing a second dielectric layer over the first dielectric layer, the first via, and the second via; patterning an opening in the second dielectric layer with a single-patterning photolithography process, the opening having a main portion, a first projecting portion extending from a first side of the main portion, and a second projecting portion extending from a second side of the main portion, the first projecting portion and the main portion of the opening exposing the first via, the second projecting portion and the main portion of the opening exposing the second via; and filling the opening with a conductive material to form a first metal line physically and electrically coupled to the first via and the second via.

In some embodiments of the method, patterning the opening includes: projecting a radiation beam toward the second dielectric layer, the radiation beam having a pattern of the opening. In some embodiments of the method, the single-patterning photolithography process is an extreme ultraviolet (EUV) lithography process. In some embodiments of the method, filling the opening with the conductive material includes: plating the conductive material in the opening; and planarizing the conductive material and the second dielectric layer to form the first metal line from remaining portions of the conductive material, top surfaces of the first metal line and the second dielectric layer being planar after the planarizing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin extending from an n-type well region of a substrate;
   growing a first source/drain region in the first fin;
   forming a second fin extending from the n-type well region of the substrate;
   growing a second source/drain region in the second fin;
   depositing a first dielectric layer over the first source/drain region and the second source/drain region;
   forming a first via through the first dielectric layer to electrically couple the first source/drain region, the first via having a width in a range of 15 nm to 20 nm;
   forming a second via through the first dielectric layer to electrically couple the second source/drain region, the second via having a width in a range of 15 nm to 20 nm;
   depositing a second dielectric layer over the first dielectric layer, the first via, and the second via;
   patterning an opening in the second dielectric layer with a single-patterning photolithography process, the opening having a main portion, a first projecting portion extending from a first side of the main portion, and a second projecting portion extending from a second side of the main portion, the first projecting portion and the main portion of the opening exposing the first via, the second projecting portion and the main portion of the opening exposing the second via, wherein the first projecting portion and the second projecting portion each have a first width, and the main portion has a second width, the first width being less than the second width; and
   filling the opening with a conductive material to form a first metal line physically and electrically coupled to the first via and the second via.

2. The method of claim 1, wherein patterning the opening comprises:
   projecting a radiation beam toward the second dielectric layer, the radiation beam having a pattern of the opening.

3. The method of claim 1, wherein the single-patterning photolithography process is an extreme ultraviolet (EUV) lithography process.

4. The method of claim 1, wherein filling the opening with the conductive material comprises:
   plating the conductive material in the opening; and
   planarizing the conductive material and the second dielectric layer to form the first metal line from remaining portions of the conductive material, top surfaces of the first metal line and the second dielectric layer being planar after the planarizing.

5. The method of claim 1, wherein the opening in the second dielectric layer further has a third projecting portion and a periphery portion, the third projecting portion connecting the main portion to the periphery portion.

6. The method of claim 1 further comprising:
   forming a third fin extending from a first p-type well region of the substrate;
   growing a third source/drain region in the third fin; and
   forming a third via through the first dielectric layer to electrically couple the third source/drain region, the third via having a width in a range of 10 nm to 15 nm.

7. The method of claim 6, further comprising:
   forming a fourth fin extending from a second p-type well region of the substrate, the n-type well region disposed between the first p-type well region and the second p-type well region;

growing a fourth source/drain region in the fourth fin; and
forming a fourth via through the first dielectric layer to electrically couple the fourth source/drain region, the fourth via having a width in a range of 10 nm to 15 nm.

8. The method of claim 7, wherein the first via is spaced apart from the third via by a first distance, and the first via is spaced apart from the fourth via by a second distance, the first distance greater than the second distance.

9. The method of claim 8, wherein the first distance is in a range of 70 nm to 90 nm and the second distance is in a range of 45 nm to 65 nm.

10. A method comprising:
forming a n-type well region in a substrate;
forming a first pull-up transistor in the n-type well region, the first pull-up transistor comprising a first fin and a first source/drain region, the first fin extending from the n-type well region of the substrate, the first source/drain region disposed in the first fin;
forming a second pull-up transistor in the n-type well region, the second pull-up transistor comprising a second fin and a second source/drain region, the second fin extending from the n-type well region of the substrate, the second source/drain region disposed in the second fin;
forming an interconnect structure over the substrate comprising:
depositing a first dielectric layer over the first source/drain region and the second source/drain region;
patterning a plurality of openings in the first dielectric layer with an extreme ultraviolet (EUV) lithography process, the plurality of openings including a first opening; and
forming a first conductive feature in the first opening, the first conductive feature having a main portion, a first pad portion extending from a first side of the main portion, and a second pad portion extending from a second side of the main portion, the first pad portion being over and electrically connected to the first source/drain region of the first pull-up transistor, the second pad portion being over and electrically connected to the second source/drain region of the second pull-up transistor, wherein the first pad portion and the second pad portion each have a first width, and the main portion has a second width, the first width being less than the second width.

11. The method of claim 10, wherein forming the interconnect structure further comprises:
depositing a second dielectric layer over the first source/drain region and the second source/drain region;
forming a first via through the second dielectric layer, the first via electrically coupling the first source/drain region to the first pad portion of the first conductive feature; and
forming a second via through the second dielectric layer, the second via electrically coupling the second source/drain region to the second pad portion of the first conductive feature,
wherein the first dielectric layer is deposited over the second dielectric layer, the first via, and the second via.

12. The method of claim 11, wherein the first via and the second via each have a width in a range of 15 nm to 20 nm.

13. The method of claim 10 further comprising:
forming a first p-type well region and a second p-type well region in the substrate, the n-type well region disposed between the first p-type well region and the second p-type well region;
forming a first pass-gate transistor in the first p-type well region, the first pass-gate transistor comprising a third source/drain region;
forming a second pass-gate transistor in the second p-type well region, the second pass-gate transistor comprising a fourth source/drain region;
forming a first pull-down transistor in the first p-type well region, the first pull-down transistor comprising a fifth source/drain region; and
forming a second pull-down transistor in the second p-type well region, the second pull-down transistor comprising a sixth source/drain region.

14. The method of claim 13, wherein the plurality of openings further includes a second opening, a third opening, a fourth opening, and a fifth opening, and wherein forming the interconnect structure further comprises:
forming a second conductive feature in the second opening, the second conductive feature being over and electrically connected to the third source/drain region of the first pass-gate transistor;
forming a third conductive feature in the third opening, the third conductive feature being over and electrically connected to the fourth source/drain region of the second pass-gate transistor;
forming a fourth conductive feature in the fourth opening, the fourth conductive feature being over and electrically connected to the fifth source/drain region of the first pull-down transistor; and
forming a fifth conductive feature in the fifth opening, the fifth conductive feature being over and electrically connected to the sixth source/drain region of the second pull-down transistor.

15. The method of claim 14, wherein patterning the plurality of openings comprises:
projecting a radiation beam toward the first dielectric layer, the radiation beam having a pattern of the first conductive feature, the second conductive feature, the third conductive feature, the fourth conductive feature, and the fifth conductive feature.

16. A method comprising:
forming a first fin and a second fin each extending from an n-type well region of a substrate;
forming a first gate stack over a first channel region of the first fin;
forming a second gate stack over a second channel region of the second fin;
growing a first source/drain region and a second source/drain region in the first fin, the first channel region disposed between the first source/drain region and the second source/drain region;
growing a third source/drain region and a fourth source/drain region in the second fin, the second channel region disposed between the third source/drain region and the fourth source/drain region;
depositing a first dielectric layer over the first source/drain region, the second source/drain region, the third source/drain region, and the fourth source/drain region;
forming a first source/drain contact through the first dielectric layer to physically and electrically couple the first source/drain region;
forming a second source/drain contact through the first dielectric layer to physically and electrically couple the second source/drain region;
forming a third source/drain contact through the first dielectric layer to physically and electrically couple the third source/drain region;

forming a fourth source/drain contact through the first dielectric layer to physically and electrically couple the fourth source/drain region;

depositing a second dielectric layer over the first dielectric layer, the first source/drain contact, the second source/drain contact, the third source/drain contact, the fourth source/drain contact, the first gate stack, and the second gate stack;

forming a first via through the second dielectric layer to physically and electrically couple the first source/drain contact;

forming a second via through the second dielectric layer to physically and electrically couple the third source/drain contact;

forming a third via through the second dielectric layer to physically and electrically couple each of the fourth source/drain contact and the first gate stack;

forming a fourth via through the second dielectric layer to physically and electrically couple each of the second source/drain contact and the second gate stack;

depositing a third dielectric layer over the second dielectric layer, the first via, the second via, the third via, and the fourth via;

patterning an opening in the third dielectric layer with a single-patterning photolithography process, the opening having a main portion, a first projecting portion extending from a first side of the main portion, and a second projecting portion extending from a second side of the main portion, the first projecting portion being over the first via, the second projecting portion being over the second via, wherein the first projecting portion and the second projecting portion each have a first width, and the main portion has a second width, the first width being less than the second width; and filling the opening with a conductive material to form a first metal line.

17. The method of claim 16, wherein the single-patterning photolithography process is an extreme ultraviolet (EUV) lithography process.

18. The method of claim 16, wherein the first via and the second via each have a width in a range of 15 nm to 20 nm.

* * * * *